US012592358B1

(12) United States Patent
Principe et al.

(10) Patent No.: US 12,592,358 B1
(45) Date of Patent: Mar. 31, 2026

(54) SPARSE SAMPLING USING A PROGRAMMATICALLY RANDOMIZED SIGNAL MODULATING A CARRIER SIGNAL

(71) Applicant: Synchrotron Research, Inc., Melbourne Beach, FL (US)

(72) Inventors: Edward Principe, Melbourne Beach, FL (US); Andrew Stevens, Southlake, TX (US); Conan Weiland, Manorville, NY (US); Jeffrey Hagen, Independence, MN (US); Brian Kempshall, Cocoa, FL (US); Kirk Scammon, Cocoa, FL (US); Zachary Russell, Boone, NC (US); Shane Didona, Durham, NC (US); Mathieu Therezien, Vancouver (CA); Tomas McIntee, Chapel Hill, NC (US)

(73) Assignee: Synchrotron Research, Inc., Melbourne Beach, FL (US)

( * ) Notice: Subject to any disclaimer, the term of this patent is extended or adjusted under 35 U.S.C. 154(b) by 458 days.

(21) Appl. No.: 18/165,757

(22) Filed: Feb. 7, 2023

Related U.S. Application Data

(63) Continuation-in-part of application No. 17/394,704, filed on Aug. 5, 2021, now Pat. No. 11,721,519.

(51) Int. Cl.
H01J 37/26 (2006.01)
H01J 37/28 (2006.01)

(52) U.S. Cl.
CPC ............. H01J 37/265 (2013.01); H01J 37/28 (2013.01); H01J 2237/2487 (2013.01)

(58) Field of Classification Search
CPC ... H01J 37/265; H01J 37/28; H01J 2237/2487
See application file for complete search history.

(56) References Cited

U.S. PATENT DOCUMENTS 5,543,935 A   8/1996   Harrington
5,866,300 A   2/1999   Satoh et al.
(Continued)

FOREIGN PATENT DOCUMENTS

CN   102865833 A   1/2013
CN   103090971 A   5/2013
(Continued)

OTHER PUBLICATIONS

Willett, Rebecca, Smooth Continuous Trajectory Errata, "Errata: Sampling Trajectories for Sparse Image Recovery", Duke University, 2011, 12 pages.
(Continued)

*Primary Examiner* — Lisa M Caputo
*Assistant Examiner* — Nyla Gavia
(74) *Attorney, Agent, or Firm* — Westman, Champlin & Koehler, P.A.

(57) ABSTRACT

A system including a sparse sampling system having a processor and a non-transitory computer-readable medium. The sparse sampling system generates, a first programmable primary carrier signal and a first secondary programmable signal that modulates the first programmable primary carrier signal through a first randomized modulation that defines X-coordinates of a set of scan pattern coordinates of an object scan, a second programmable primary carrier signal and a second secondary programmable signal that modulates the second programmable primary carrier signal through a second randomized modulation that defines Y-coordinates of the set of scan pattern coordinates of the object scan, and a third programmable output signal that defines Z-coordinates of the set of scan pattern coordinates of the object scan based on a predetermined rule. The sparse sampling system also transmits the generated signals to a scanning probe device.

20 Claims, 14 Drawing Sheets

(56) References Cited

U.S. PATENT DOCUMENTS

| | | | |
|---|---|---|---|
| 6,008,489 | A | 12/1999 | Elings et al. |
| 6,057,907 | A | 5/2000 | Satoh et al. |
| 6,628,322 | B1 | 9/2003 | Cerruti |
| 7,312,448 | B2 | 12/2007 | Principe |
| 7,755,645 | B2 * | 7/2010 | Sun ........................... G06T 5/77 |
| | | | 382/284 |
| 8,178,838 | B2 | 5/2012 | Principe |
| 9,620,330 | B2 | 4/2017 | Potocek et al. |
| 10,002,742 | B2 | 6/2018 | Potocek et al. |
| 10,109,453 | B2 | 10/2018 | Stevens et al. |
| 10,170,274 | B2 | 1/2019 | Stevens et al. |
| 10,224,175 | B2 | 3/2019 | Stevens et al. |
| 10,256,072 | B2 | 4/2019 | Stevens et al. |
| 10,541,109 | B2 | 1/2020 | Stanfill et al. |
| 10,580,614 | B2 | 3/2020 | Stevens et al. |
| 2008/0106654 | A1 | 5/2008 | Benner |
| 2010/0302086 | A1 | 12/2010 | Dudgeon et al. |
| 2012/0038786 | A1 * | 2/2012 | Kelly ..................... H04N 25/41 |
| | | | 348/222.1 |
| 2015/0371815 | A1 | 12/2015 | Potocek et al. |
| 2016/0118219 | A1 | 4/2016 | Potocek et al. |
| 2016/0275639 | A1 * | 9/2016 | Holub ................ H04N 1/32352 |
| 2018/0025887 | A1 * | 1/2018 | Kovarik ................. G01Q 10/06 |
| | | | 250/310 |
| 2020/0411278 | A1 | 12/2020 | Nagai |
| 2022/0239384 | A1 | 7/2022 | Hill et al. |

FOREIGN PATENT DOCUMENTS

| | | | | |
|---|---|---|---|---|
| JP | H0974060 | A | 3/1997 | |
| JP | 2016-004785 | A | 1/2016 | |
| JP | 2016-085966 | A | 5/2016 | |
| JP | 2020501130 | A * | 1/2020 | ............. G01S 7/497 |
| WO | 2012/078415 | A2 | 6/2012 | |
| WO | WO-2020242778 | A1 * | 12/2020 | ............... H03D 1/00 |
| WO | WO 2013052535 | A1 * | 7/2021 | ........... G06T 1/0071 |

OTHER PUBLICATIONS

Willett, Rebecca, Trajectory Errata, "Errata: Sampling Trajectories for Sparse Image Recovery", Duke University, 2011, 12 pages.

Stevens, Andrew et al., "Subsampled STEM-Ptychography", Jul. 5, 2018, 5 pages.

Stevens, Andrew, "Compressive Sensing in Transmission Electron Microscopy", Dissertation submitted in partial fulllment of the requirements for the degree of Doctor of Philosophy in the Department of Electrical & Computer Engineering in the Graduate School of Duke University, 2018, 177 pages.

Stevens, A. et al., "A sub-sampled approach to extremely low-dose STEM", Citation: Appl. Phys. Lett. 112, 043104 (2018); View online: https://doi.org/10.1063/1.5016192; View Table of Contents: http://aip.scitation.org/toc/apl/112/4; Published by the American Institute of Physics, 6 pages.

Kovarik, L. et al., "Implementing an accurate and rapid sparse sampling approach for low-dose atomic resolution STEM imaging", Cite as: Appl. Phys. Lett. 109, 164102 (2016); https://doi.org/10.1063/1.4965720; Submitted: Aug. 8, 2016; Accepted: Oct. 7, 2016; Published Online: Oct. 21, 2016, 6 pages.

Willett, Rebecca M., "Smooth Sampling Trajectories for Sparse Recovery in MRI", Department of Electrical and Computer Engineering, Duke University, Durham, NC 27708, 978-1-4244-4128-0/11/$25.00 © 2011 IEEE, 1044, ISBI 2011, 4 pages.

Hujsak, Karl et al., "Suppressing Electron Exposure Artifacts: An Electron Scanning Paradigm with Bayesian Machine Learning", Microsc. Microanal., p. 1 of 11, doi: 10.1017/S1431927616011417, © Microscopy Society of America 2016, 11 pages.

Béché, A. et al., "Development of a fast electromagnetic beam blanker for compressed sensing in scanning transmission electron microscopy", Cite as: Appl. Phys. Lett. 108, 093103 (2016); https://doi.org/10.1063/1.4943086; Submitted: Nov. 26, 2015; Accepted: Feb. 19, 2016; Published Online: Mar. 1, 2016, 6 pages.

International Search Report and Written Opinion for International Application No. PCT/US2022/38700, dated Jan. 3, 2023, 8 pages.

International Search Report and Written Opinion for International Application No. PCT/US2023/012550, dated May 23, 2023, 14 pages.

European search report for European patent application No. 22853726.2, dated Sep. 13, 2024, 5 pages.

Communication pursuant to Article 94(3) EPC for European patent application No. 22853726.2, dated Sep. 25, 2024, 7 pages.

Invitation pursuant to Rule 62a(1) EPC, for European Patent Application No. 22 853 726.2, dated Jul. 19, 2024, 2 pages.

Notice of Reasons for Rejection, for Japanese Patent Application No. 2024-506175, dated Jun. 18, 2024, 8 pages.

Office Action for related Korean patent application No. 10-2025-7028537 (with machine translation), mailed on Dec. 3, 2025, 6 pages.

Allowance Notification for related Japanese patent application No. 2025-546108 (with machine translation), mailed on Jan. 6, 2026, 2 pages.

* cited by examiner

| | | |
|---|---|---|
| X | X | X |
| X | O | X |
| X | X | X |

| | | | | |
|---|---|---|---|---|
| X | X | X | X | X |
| X | | | | X |
| X | | O | | X |
| X | | | | X |
| X | X | X | X | X |

| | | | | | | |
|---|---|---|---|---|---|---|
| X | X | X | X | X | X | X |
| X | | | | | | X |
| X | | | | | | X |
| X | | | O | | | X |
| X | | | | | | X |
| X | | | | | | X |
| X | X | X | X | X | X | X |

| | | | | | | | | |
|---|---|---|---|---|---|---|---|---|
| X | X | X | X | X | X | X | X | X |
| X | | | | | | | | X |
| X | | | | | | | | X |
| X | | | | | | | | X |
| X | | | | O | | | | X |
| X | | | | | | | | X |
| X | | | | | | | | X |
| X | | | | | | | | X |
| X | X | X | X | X | X | X | X | X |

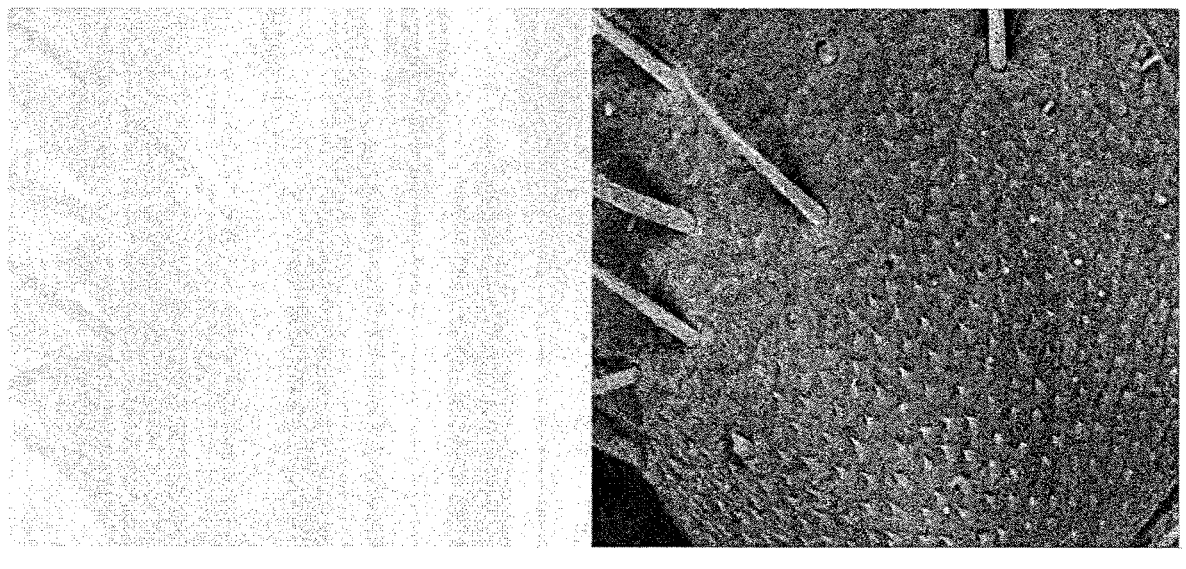
FIG. 14A                                                              FIG. 14B

SPARSE SAMPLING USING A PROGRAMMATICALLY RANDOMIZED SIGNAL MODULATING A CARRIER SIGNAL

This application is a continuation-in-part of U.S. application Ser. No. 17/394,704, filed on Aug. 5, 2021, the content of which is hereby incorporated by reference in its entirety.

STATEMENT REGARDING FEDERALLY SPONSORED RESEARCH AND DEVELOPMENT

This invention was made in part by Government support under Contract Numbers SB1341-15-CN-0050 and SB1341-16-SE-0203 awarded by the National Institute of Standards and Technology. The Government may have certain rights in this invention.

SUMMARY

In one embodiment, a system is provided. The system included a sparse sampling system having a processor and a non-transitory computer-readable medium. The sparse sampling system is configured to generate, a first programmable primary carrier signal and a first secondary programmable signal that modulates the first programmable primary carrier signal through a first randomized modulation that defines X-coordinates of a set of scan pattern coordinates of an object scan, a second programmable primary carrier signal and a second secondary programmable signal that modulates the second programmable primary carrier signal through a second randomized modulation that defines Y-coordinates of the set of scan pattern coordinates of the object scan, and a third programmable output signal that defines Z-coordinates of the set of scan pattern coordinates of the object scan based on a predetermined rule. The sparse sampling system is also configured to transmit the generated first and second programmable primary carrier signals, the first and second secondary programmable signals, and the third programmable output signal to a scanning probe device.

In another embodiment, a method is provided. The method includes generating, by a sparse sampling system having a processor and a non-transitory computer-readable medium, a first programmable primary carrier signal and a first secondary programmable signal that modulates the first programmable primary carrier signal through a first randomized modulation that defines X-coordinates of a set of scan pattern coordinates of an object scan. The method also includes generating, by the sparse sampling system, a second programmable primary carrier signal and a second secondary programmable signal that modulates the second programmable primary carrier signal through a second randomized modulation that defines Y-coordinates of the set of scan pattern coordinates of the object scan. The method further includes generating, by the sparse sampling system, a third programmable output signal that defines Z-coordinates of the set of scan pattern coordinates of the object scan based on a predetermined rule. The generated first and second programmable primary carrier signals, the first and second secondary programmable signals, and the third programmable output signal are transmitted by the sparse sampling system to a scanning probe device.

In yet another embodiment, an apparatus is provided. The apparatus includes a sparse sampling pattern generator configured to generate, a first programmable primary carrier signal and a first secondary programmable signal that modulates the first primary carrier signal through a first randomized modulation that defines X-coordinates of a set of scan pattern coordinates of an object scan. The sparse sampling pattern generator is also configured to generate a second programmable primary carrier signal and a second secondary programmable signal that modulates the second primary carrier signal through a second randomized modulation that defines Y-coordinates of the set of scan pattern coordinates of the object scan. The sparse sampling pattern generator is further configured to generate a third programmable output signal that defines Z-coordinates of the set of scan pattern coordinates of the object scan based on a predetermined rule. The apparatus also includes a controller coupled to the sparse sampling pattern generator and configured to provide the first and second programmable primary carrier signal, the first and second secondary programmable signal, and the third programmable output signal to scan inputs of a scanning probe device configured to scan an object. The apparatus further includes at least one object signal response converter configured to receive scan response signals from at least one object response detector that detects a response of the object to scan probe signals directed at the object by the scanning probe device, the at least one object response converter is coupled to the controller and configured to convert the analog scan response signals to digital scan response signals. A sampling reconstruction system is communicatively coupled to the controller. The sampling reconstruction system is configured to receive the digital scan response signals from the controller, and responsively reconstruct an amalgamate image of the object scanned by the scanning probe device from the sampled object response signals.

In still another embodiment, a system is provided. The system includes a sampling reconstruction system having a processor and a non-transitory computer-readable medium. The sampling reconstruction system is configured to receive a set of sub-sampled addressable pixel elements, and to reconstruct missing pixels from the set of sub-sampled addressable pixel elements by adaptive real-time inpainting.

Other features and benefits that characterize embodiments of the disclosure will be apparent upon reading the following detailed description and review of the associated drawings.

BRIEF DESCRIPTION OF THE DRAWINGS

FIG. 14A is an image of a 90% sparse acquisition on 4K×4K full pixel density image using a Hilbert-style space-filling curve in accordance with an embodiment of the disclosure.

FIG. 14B is a reconstructed image of FIG. 14A using ARTI.

DETAILED DESCRIPTION OF ILLUSTRATIVE EMBODIMENTS

Figure 1:
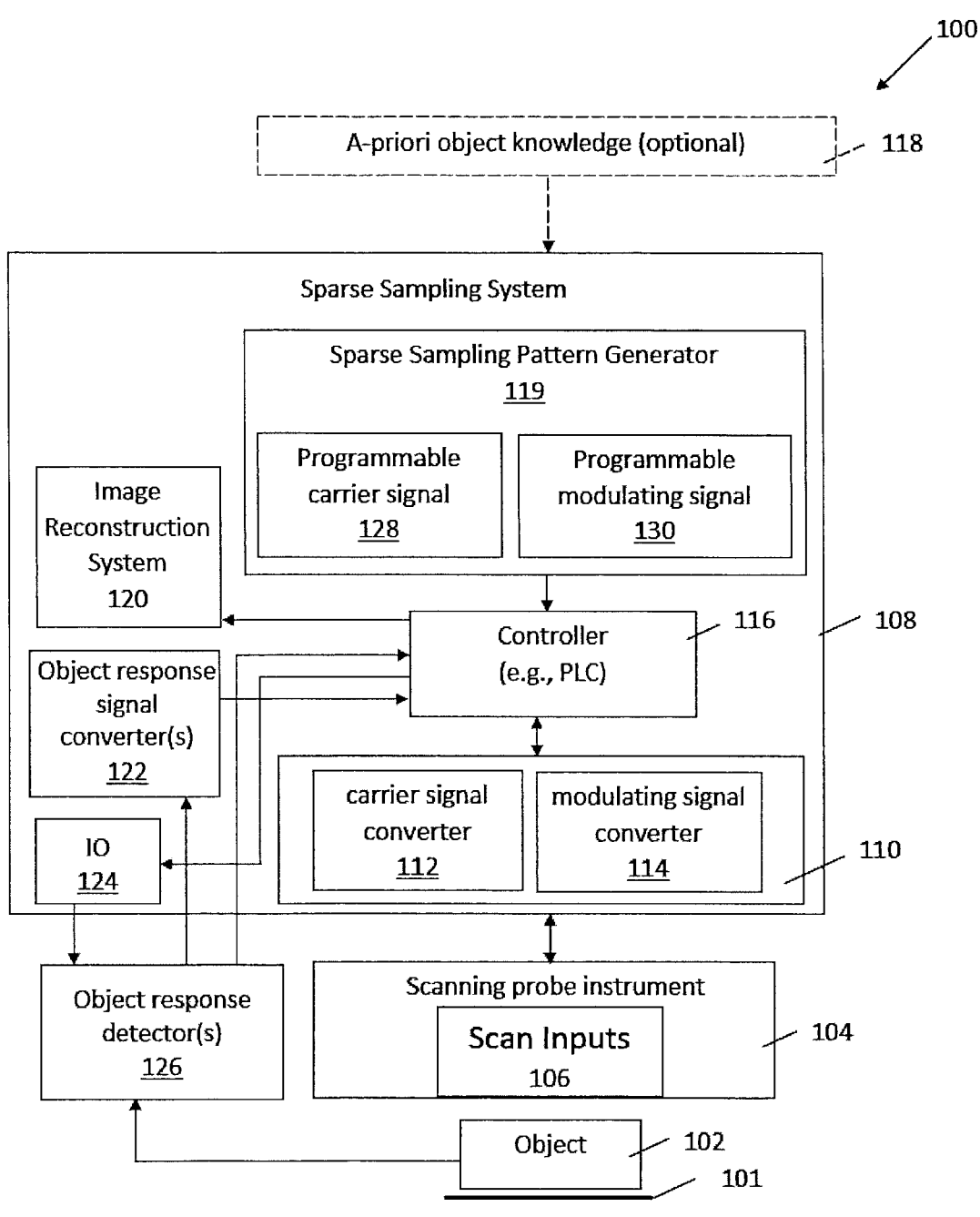
FIG. 1 is a diagrammatic illustration of a sparse sampling scanning system in which embodiments of the disclosure may be employed.

Embodiments of the disclosure generally relate to sparse sampling applied to analytical instruments which utilize one or more serial scanning systems, or sub-systems, and computational methods applied to reconstruct amalgamate representations of the object being sparsely sensed through interaction with one or more analytical probes and response signals collected by one or more response signal detectors.

Acquisition times for serial scanning analytical instruments can be reduced significantly by application of sparse sampling, sub-sampling or compressed sensing. Such instruments include, by way of example, scanning electron microscopes, electron spectrometers, imaging electron spectrometers, ion microscopes, ion spectrometers, laser confocal microscopes and x-ray spectrometers. An object being sensed may experience reversible modification (e.g., electron or ion charge accumulation) or irreversible modification (e.g., changes in bonding, physical deformation, ion implantation, sputtering) due to interaction with the analytical probe. Detrimental probe-material interactions are reduced through sparse sampling. Sparse sampling and sparse sampling reconstruction benefits from an approach which mitigates artifacts and limitations associated with electro-mechanical scanning systems. Sources of serial scanning artifacts include, by way of example, dynamic hysteresis, slew and non-linear response. Examples of systems subject to one or more artifacts which can influence the quality of sparse sampling and sparse sampling reconstruction include, by way of example, magnetic scan devices, electromagnetic scan devices, electrostatic scan devices, electromagnetic probe blanking systems and electrostatic probe blanking systems.

A sparse sampling approach which mitigates serial scanning artifacts while allowing higher scanning rates benefits the quality of sparse sampling and sparse sampling reconstruction. Constructing sparse sampling scan patterns which are smooth and predominantly continuous on the carrier signal scale while simultaneously invoking statistical randomness at a discrete modulating perturbing signal scale, mitigates typical artifacts in electro-mechanical scanning systems and reduces the performance requirements for, or eliminates the need for, dynamic or high-speed probe blanking. An approach which permits a continuously variable and adaptive degree of sparse sampling enables a higher degree of freedom in the design of scan strategies to probe an object and extract information. Freedom in the degree of sparse sampling and the structure of the carrier signal pattern enables adaptive scan strategies based upon a-priori knowledge of the object being sampled or through information acquired while sensing the object. A-priori knowledge may include geometric information, chemical information and structural information. Information acquired during sparse sampling is derived from the probe-object response function over the governing interaction volume, and in some cases, may permit forward-looking modeling to aid adaptive sparse sampling scan strategies.

In embodiments of the disclosure, a sparse sampling approach employs compound signal convertors. In one embodiment, each element of the compound signal converter includes a primary carrier signal converter modulated by a secondary signal converter wherein the output of the secondary signal converter is referenced to the primary carrier signal converter output. The secondary modulating signal converter is programmatically randomized. One embodiment includes a pair of such "primary-secondary" compound signal converters configured as a programmable X-Y scan pattern generator wherein one "primary-secondary" compound signal converter generates the X coordinate and the second "primary-secondary" compound signal converter generates the Y coordinate, and wherein all outputs are coordinated by a programmable logic controller. Such a compound signal converter configured as an X-Y pattern generator may be programmed to produce an X-Y pattern including a plurality of sequential, ordered and randomized X-Y coordinates, wherein each coordinate is the summation of the primary X-Y carrier signal converters and the secondary X-Y modulating signal converters, wherein the latter acts as a randomizing signal added to the former. In an X-Y scan pattern generator configured in this manner, the X-Y carrier signal pattern can be considered as a "guiding center" path referenced by the programmatically randomized modulating X-Y signal pattern to define the sparse sampling coordinates. The aforementioned configured X-Y scan pattern generator is capable of programming a variety of arbitrarily smooth and arbitrarily continuous X-Y topological curves which include a carrier signal X-Y pattern which is programmatically randomized by the modulating signal X-Y pattern and which, in aggregate, generate a randomized sparse sampling X-Y signal pattern.

Through this approach, the degree of sparsity produced by the aggregate X-Y pattern may be smoothly and continuously regulated in increments of a fractional percent from 0% to greater than 99% sparsity. Statistical randomness is imparted through the randomness programmed into the aggregate X-Y modulated signal pattern. Carrier signal X-Y patterns supported through this approach include, by way of example, continuous space-filling curves, serpentine patterns, fly-back patterns, generalized polygon patterns and custom path coordinates. Compound signal converters configured as a pattern generator capable of conveying a variety of carrier signals which serve as a guiding path perturbed by the action of a modulating signal creating a randomized pattern of coordinates constitutes a versatile and generalized sparse sampling approach applicable to serial scanning probe instruments. This sparse sampling approaches defined herein mitigate artifacts and/or detrimental aspects intrinsic to serial scanning probe instruments. Prior to providing additional details regarding the different embodiments, a description of an illustrative operating environment is provided below.

FIG. 1 shows an illustrative operating environment in which certain specific embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that like reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that, when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 is a diagrammatic illustration of a scanning tool 100 for obtaining a representation of an object 102 in which at least some embodiments of the disclosure may be included. As can be seen in FIG. 1, system 100 includes a scanning probe instrument 104 (e.g., scanning electron microscope, electron spectrometer, imaging electron spectrometer, scanning ion microscope, imaging ion spectrometer, laser confocal microscope, x-ray spectrometer, etc.) that includes scan inputs 106 for scanning an object such as 102.

System 100 also includes a sparse sampling system 108. In general, system 108 may include at least one application specific integrated circuit (ASIC) having at least one processor, at least one non-transitory computer-readable medium and any other suitable circuitry that is capable of generating signals in accordance with embodiments of the disclosure, storing the generated signals, and providing the generated signals to a scanning device. In one embodiment system 108 includes at least one compound signal converter 110 capable of converting both a primary carrier signal and a secondary modulating signal. Each compound signal converter 110 may include a carrier signal converter 112, and a secondary signal converter 114. The secondary signal converter 114 is configured to modulate the primary carrier signal converter 112. An output of the secondary modulating signal converter 114 is referenced to an output of the primary carrier signal converter 112. One embodiment of the compound signal converter 110 uses a primary signal converter carrier signal with an output range corresponding to the operable (e.g., full scale) scan field of the scanning probe instrument scan inputs 106, referenced by a secondary modulating signal converter operating over a reduced range and higher rate. One embodiment of compound signal converter 110 utilizes one digital-to-analog converter (DAC) to convert the combined signal including the programmable primary carrier signal 128 and programmable secondary modulating signal 130, performing the function of both carrier signal converter 112 and modulating signal converter 114.

Another embodiment of compound signal converter 110 uses a DAC as the primary carrier signal converter 112 and a separate DAC as modulating signal converter 114, wherein modulating signal DAC 114 is referenced to the carrier output of carrier signal DAC 112. The function of the DACs in all embodiments is to convert digital signals conveyed from a sparse sampling pattern generator 119 through a controller 116 into analog signals (e.g., voltages), which are then conveyed across a suitable transmission line (e.g., coaxial cable) to the scan inputs 106 of the scanning probe instrument 104. One embodiment of the sparse sampling system compound signal converter 110 configures the modulating signal converter 114 as a DAC which is referenced to a particular bit depth on the carrier signal converter 112, configured as a DAC. In one embodiment of compound signal converter 110, the modulating signal DAC 114 is referenced to the bit depth corresponding to a noise floor of the primary carrier signal DAC 112. In a particular embodiment of compound signal converter 110, secondary modulating signal DAC 114 is referenced to the least significant bit of a primary carrier signal DAC 112. In another embodiment of compound signal converter 110, using DACs as signal converters, the secondary modulating signal converter DAC 114 amplitude is restricted relative to the maximum amplitude of primary carrier signal converter DAC 112 (e.g., DAC 114 has a smaller voltage range than DAC 112). In one embodiment of compound signal converter 110 using DACs, the secondary modulating signal converter DAC 114 has a higher frequency response relative to primary carrier signal converter DAC 112 (e.g., DAC 114 is faster than DAC 112). In another embodiment of compound signal converter 110 using DACs, the gain of secondary modulating signal converter DAC 114 referenced to primary carrier signal converter DAC 112 output is programmable. In one embodiment of the sparse sampling system 108, compound signal converter 110 is configured as an X-Y pattern generator wherein X includes at least one carrier signal converter 112 and at least one modulating signal converter 114 and Y includes at least one primary carrier signal converter 112 and at least one secondary modulating signal converter 114.

In an embodiment of the sparse sampling system 108 configured as an X-Y sparse sample pattern generator, the carrier signal converter 112 and modulating signal converter 114 outputs convey through one transmission line to scanning probe instrument scan inputs 106. In another embodiment of the sparse sampling system 108 configured as an X-Y sparse sample pattern generator, the primary carrier signal converter 112 and secondary modulating signal converter 114 outputs convey through separate transmission lines to scanning probe instrument scan inputs 106, the actions of which are both synchronized through controller 116. For example, the primary carrier signals 112 could convey to a set of upper deflection coils (not shown) of a scanning transmission electron microscope and the secondary modulating signals compound signal converter 114 could convey to a lower set of deflection coils (not shown). The sparse sampling system compound signal converter 110 is extensible to "N" number of signal converter elements. For example, compound signal converter 114 include a primary, secondary and tertiary signal converter elements. The sparse sampling system 108 is extensible as a triad of compound signal converters to configure an X-Y-Z pattern generator. One embodiment of the sparse sampling system 108 configured as an X-Y-Z pattern generator is suitable for three-dimensional scanning probe instruments including, but not limited to, a confocal scanning laser microscope (CSLM).

System 100 further includes one or more object response signal converters 122 that convert a "response" signal of the object 102 from one or more object response detector(s) 126. The object response detector(s) 126 may be of various types, and depend upon the type(s) of response signals collected from the object 102 (e.g., secondary electrons, backscatter electrons, Auger electrons, secondary ions, X-rays.) One embodiment of object response signal converter 122 uses an analog-to-digital converter (ADC) signal converter or plurality of ADCs to collect signals from the object response detectors 126. One embodiment of object response signal converter 122 could include a pulse process converter (e.g., to convert x-ray object response detector signals). In one embodiment of the sparse sampling system 108, the degree of oversampling from the object response signal converters 122, relative to the dwell time used to collect the object response detector(s) 126 signals induced from the object being sparsely sensed, may be averaged to improve the signal-to-noise ratio (SNR) of the response signals. For example, and assuming a sufficiently high bandwidth object response detector 126; a dwell time of one microsecond (1 us) and a sparse sampling system clock rate of 50 MHz (20 nanoseconds), would correspond to an oversampling ratio of 50 and allow a corresponding improvement in SNR of over 7. In one embodiment of the sparse sampling system 108, the object response detector(s) 126 operate continuously or under the control of the scanning probe instrument 104. In another embodiment of the sparse sampling system 108, the object response detector(s) 126 are operably triggered through the action of an input-output object response detector(s) 126 element (e.g., a general-purpose input-output, or GPIO). In an alternative embodiment of the sparse sampling system 108, the object response detector(s) 126 transmit a trigger signal to the controller 116 to initiate and/or increment a scan or scan event action.

A controller 116, which may be a part of sparse sampling system 108, is operably coupled to the primary carrier signal converter 112, the secondary signal converters 114 and object response signal converter(s) 122. Controller 116 coordinates actions among the signal converters 112, 114, 122 as well as, in some embodiments, the object response detector(s) 126, as noted above. In one embodiment, the controller 116 is a programmable logic controller (PLC). In one embodiment, the PLC is configured as a field programmable gate array (FPGA). In a particular embodiment, the FPGA functions as a high-speed data transmission array. In one embodiment of the sparse sampling approach disclosed herein, the sparse sampling X-Y pattern coordinates are synchronized by the PLC with response signal converter data and accessed through an address list which pair the pattern coordinates and the response signals.

In some embodiments, patterns produced by the sparse sampling pattern generator 119 are adapted to extract information from object 102, based upon a-priori knowledge 118 of the object 102 being sensed, or to test an expectation of the object 102 being sensed. A-priori object knowledge 118 includes, but is not limited to, information of the object 102 geometry based upon design information such as from computer aided design (CAD) digital content or a graphic design system (GDS) (e.g., a GDSII digital file). A-priori object knowledge 118 could also be derived from lower resolution and/or larger field of view data which provides knowledge of hierarchical congestion and/or geometric density. Examples of such information include, but are not limited to, optical data or lower resolution data from the same or different scanning probe instrument. In general, a-priori object knowledge 118 includes structural information about the object 102, chemical information about the object 102, or any other suitable information.

In a typical operation, the object 102 is placed in proximity to the scanning probe on support 101. In some embodiments, support 101 is a fixed platen and the scanning probe is moveable in X-Y or X-Y-Z. In an embodiment with a moveable scanning probe, the scanning probe may move step-wise or continuously while the object 102 being sensed remains fixed and stationary. In other embodiments, support 101 is a stage which is moveable in X-Y or X-Y-Z. In one embodiment wherein the scanning probe is moveable and the object is placed upon a moveable stage, the sparse sampling approach disclosed herein may be actioned while simultaneously moving a stage or sub-stage during the sparse sampling operations, to allow a continuous or predominantly continuous dynamic sparse sampling pattern to sense the object over an area or volume which may extend to construct a continuous, largely continuous, or a plurality of continuous strips ordered over a one-dimensional, a two-dimensional or a three-dimensional space. In one embodiment of support 101, the simultaneously X-Y, or X-Y-Z moving stage is a mechanical piezoelectric stage, a laser interferometric stage, a feedback encoded stage, or an otherwise precision motion stage such that the motion of the object being sensed can be controlled within the aggregate system resolution target. In one embodiment of support 101, the simultaneously moving precision stage has a step resolution of 1 nanometer or better, along each axis.

In one embodiment of support 101, the simultaneously moving precision stage is a sub-stage affixed permanently or temporarily to an existing primary stage. In some embodiments, the object and/or the scanning probe is in ambient atmosphere. In other embodiments, the object 102 and/or elements of the scanning probe instrument 104 are in partial vacuum. The sparse sampling pattern generator 119 produces a sequential set of patterns which include a primary carrier signal path and a secondary modulating signal path, which are conveyed to the controller 116. Where applicable, sparse sampling pattern generator 119 will define the dwell time for each sparse sampling coordinate of the pattern and convey the dwell time data for each coordinate to the controller 116. Typically, a dwell time will significantly exceed the scanning probe instrument 104 probe transit time between sampling coordinates. In one embodiment of sparse sampling system 108, the dwell time is programmable for each discrete sparse sampling pattern element. For example, each pixel element could have a dwell time scaling with the gray scale intensity of a corresponding image pattern. In one embodiment of sparse sampling system 108, the programmable dwell time per sample coordinate may be truncated if a threshold signal-to-noise response signal value is attained, as actioned through the controller 116. For example, if a programmable threshold pixel intensity value for a back-scattered electron (BSE) object response detector is achieved prior to dwell time programmed for that pixel element; the dwell time will truncate for that pixel through the action of the controller 116, and in the process reduce overall sampling time.

The controller 116 regulates the sequenced timing and distributes the coordinated output signals to the compound signal converter 110, which includes a primary carrier signal converter 112 and secondary modulating signal converter 114. While the scanning probe instrument is functioning under nominal operating conditions, the sparse sampling system 108 conveys output signals from the primary carrier signal converter 112 and secondary modulating signal converter 114 to the scan inputs 106 (e.g., external scan inputs, scan amplifiers circuits or deflection coil circuits of a scanning electron microscope) of the scanning probe instrument 104. In one embodiment, the sparse sample system 108 is an integrated component of the analytical instrument and functions as the primary pattern generator for the scanning probe instrument 104. In another embodiment, the sparse sample system 108 interfaces scan inputs 106 which are external scan inputs provided by the scanning probe instrument manufacturer. For example, it is common for external scan control inputs to be provided for external scan control on scanning electron microscopes and scanning transmission electron microscopes, as well as other scanning probe instruments for use by third-party pattern generators.

The sequential probe position coordinates are controlled by the sparse sampling system output signals conveyed through the scan inputs 106 signal interface to position the scanning probe instrument 104 probe. If the scanning probe instrument 104 probe is a fixed type, the scan inputs 106 actions the X-Y or X-Y-Z stage driver interface (not shown) to position the object scan coordinate proximal to the probe. At each scanning probe coordinate the probe induces a response from the object 102, e.g., secondary electrons in the case of a scanning electron microscope or an interactive force in the case of an atomic force microscope, over the duration of the dwell time. The induced object response signal at each scan probe coordinate is concurrently sensed by the object response detector 126 over the duration of the dwell time. The signal stream induced at each scan coordinate position is concurrently conveyed through to the object response signal converter 122 to the controller 116, which correlates the scan probe position signal with the object response signal over the duration of the dwell time. In one embodiment the object response signal converter 122 signal stream is conveyed in data packets into a memory buffer included in controller 116. Controller 116 conveys an ordered set of data from object response signal converter 122 to an image reconstruction system 120, to reconstruct an amalgamate representation of the sparsely sampled object 102. In some embodiments, image reconstruction system 120 may include at least one ASIC having at least one processor, at least one non-transitory computer-readable medium and any other suitable circuitry to carry out image reconstruction in accordance with embodiments below.

In one embodiment of the image reconstruction system 120, the amalgamate representation of the sparsely sampled object 102 being sensed may be reconstructed from the object response signal converter 122 pattern collected through an appropriate object response detector 126, using inpainting reconstruction methods. A particular embodiment of an inpainting reconstruction method may be beta process factor analysis (BPFA). In one embodiment of the image reconstruction system 120, the amalgamate representation of the sparsely sampled object 102 being sensed is reconstructed from the object response signal converter pattern collected through an appropriate object response detector using a down sampling method. One embodiment of the down sampling reconstruction method seeks the pixel element nearest to the missing pixel element and assigns the identical value of the nearest element to the missing pixel element.

Figures 13A, 13B, 13C, 13D, 13E:
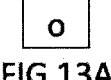
FIGS. 13A-13E are diagrammatic illustrations of one implementation of adaptive real-time inpainting (ARTI) in accordance with an embodiment of the disclosure.

In another embodiment, image reconstruction system 120 carries out reconstruction of missing pixels from a sub-sampled image by first measuring values of sub-sampled addressable pixel elements (e.g., all sub-sampled addressable pixel elements) within a one-pixel grid perimeter of the missing pixel in each direction (X-Y grid in two dimensions or X-Y-Z grid in three dimensions). A missing pixel element is graphically represented with a circular marker in FIG. 13A. A missing pixel element with a one-pixel two-dimensional search grid is graphically represented in FIG. 13B, and wherein the pixels marked by "X" are the addressable pixel elements which are searched for sub-sampled values. If one sub-sampled pixel is found in the search grid, that value is assigned to the missing pixel. If more than one sub-sampled pixel is found in the search grid, the arithmetic mean of the sub-sampled pixel values is assigned to the missing pixel. If no sub-sampled pixel values are identified within a one-pixel grid search, the measurement perimeter is increased to a two-pixel radius in each coordinate direction, as graphically illustrated in FIG. 13C, and the average pixel value of all sub-sampled pixels measured in the two-pixel radius is assigned to the missing pixel. If no sub-sampled pixel values are identified within a two-pixel element radius, the perimeter is increased to three pixels, as graphically represented in FIG. 13D. A four-pixel perimeter is graphically represented in FIG. 13E. The search grid perimeter continues to increase in steps of addressable pixel element units until at least one sub-sampled pixel value is identified. This particular reconstruction embodiment is termed Adaptive Real-Time Inpainting (ARTI). The adaptive aspect reflects the fact the search radius is programmatically increased until at least one sub-sampled pixel is identified within the search perimeter.

As the grid size perimeter becomes larger, the distance to the center of off-axes sub-sampled pixel elements becomes proportionally larger with respect to axes with an origin at the center of a missing pixel element. Larger grid size perimeters are also more likely for a higher degree of sparsity sub-sampling.

In one embodiment of ARTI, if more than one sub-sampled pixel is found in the search grid, a weighted arithmetic mean of the sub-sampled pixel values is assigned to the missing pixel. The weighting factor may, for example, be linear with respect to proximity to the missing pixel, wherein a closer sub-sampled pixel location is given a larger numerical weighting factor. Specifically, a linear inverse distance weighting factor of a sub-sample pixel would be the inverse distance to the sub-sampled pixel, divided by the sum of inverse distances to all sub-sampled pixels in a search grid perimeter.

An example of a 90% sparse sub-sampled scanning electron microscope (SEM) image acquired using an embodiment of the disclosure utilizing a Hilbert type space-filling curve is shown in FIG. 14A. The acquired image reconstructed using ARTI is graphically represented in FIG. 14B.

In another embodiment of the sparse sampling approach disclosed herein, the amalgamate representation of the sensed object is reconstructed from the sparse sampling pattern using methods based upon a Fourier sparse domain.

Figure 2:
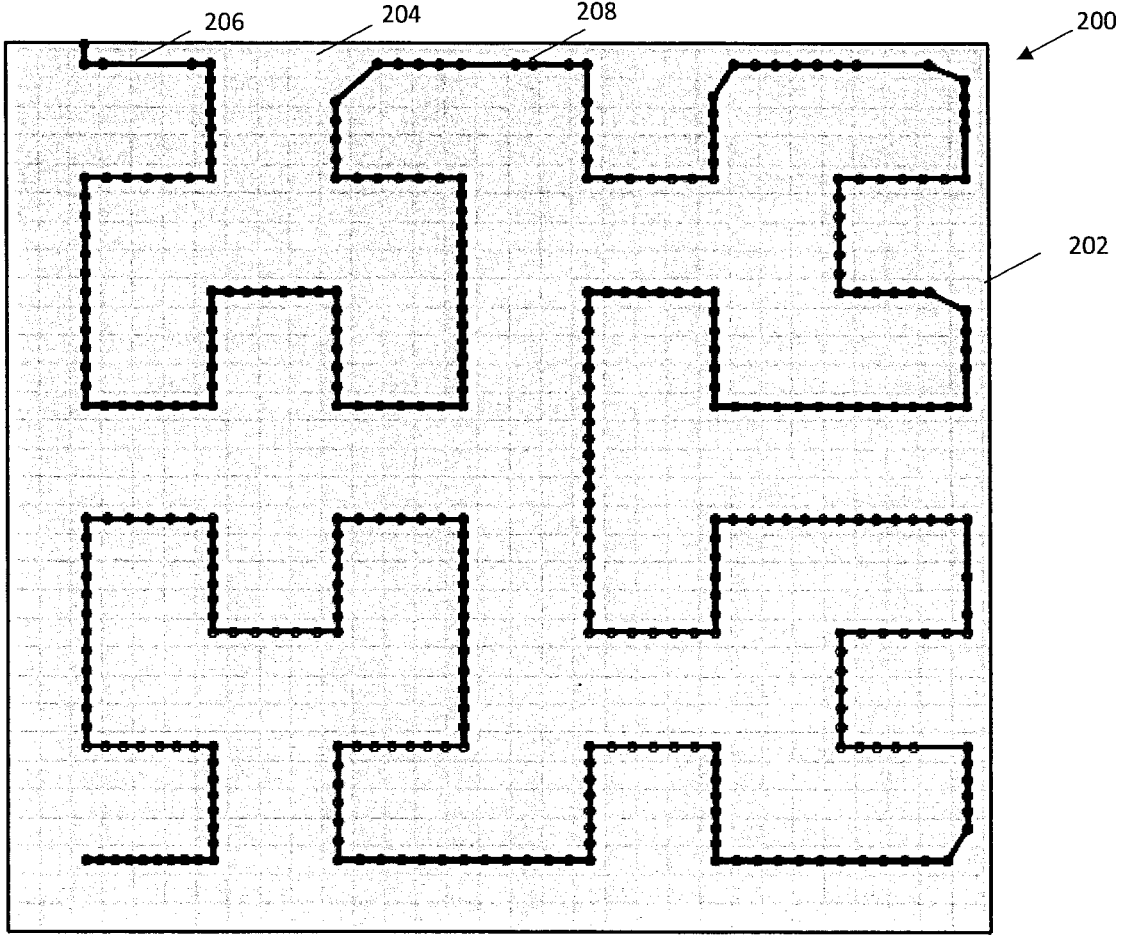
FIG. 2 is a graphical representation of one embodiment of a primary carrier signal path of the disclosure.

Examples of how the sparse sampling is carried out are provided below in connection with FIGS. 2-9. FIG. 2 is a graphical representation of one embodiment of a sparse sampling primary carrier signal path produced by sparse sampling pattern generator 119. Representation 200 is scaled for visualization purposes. Scan boundary 202 encompasses discrete probe position elements defined by grid pattern 204. A positional grid pattern in practice may exceed sixty-four million elements. Scan boundary 202 depicts a square rectilinear boundary but scan boundary 202 could also encompass a quadrilateral or non-rectilinear boundary. The primary carrier signal path 206 shown represents a contiguous Hilbert style space-filling curve. Circular markers 208 overlaid on the primary carrier signal path 206 represent discrete primary carrier signal values programmatically defined along the path 206 which act as referential values for the corresponding secondary modulating signal values. In sparse sampling system 100, the carrier signal patterns may be constructed from other topological space-filling curves which include, but are not limited to: Hilbert curves, Peano curves, Moore curves, Sierpenski curves, Lissajous curves, and variants thereof.

Figure 3:
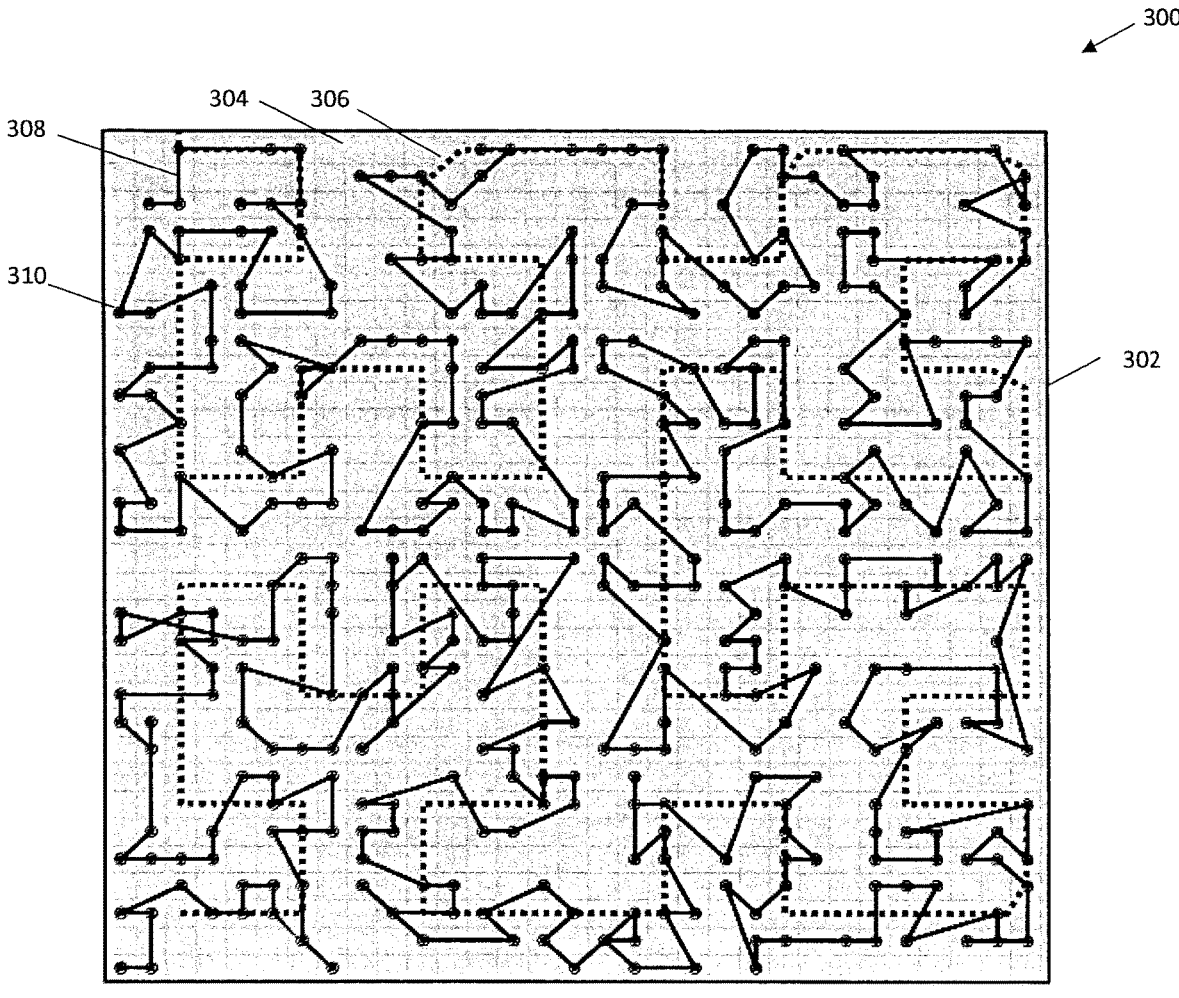
FIG. 3 is a graphical representation of a randomized secondary signal pattern (solid line) modulating a primary carrier signal (dashed) to which it is referenced.

FIG. 3 is a graphical representation 300 of a primary carrier signal path 306 identical to path 206 represented in FIG. 2, now represented as a dotted line, with the additional representation of a randomized secondary modulating signal path 308 (solid line). The vertices of each solid line segment 308 shown in FIG. 3 represent the X-Y coordinate of a discrete sparse sampling element within an element of the sampling array, as defined by the grid 304. It should be noted that the dotted line associated with carrier signal path 306 and the solid line segments associated with modulating signal path 308 are virtual expressions for visualization purposes. The set of coordinates identified by the marker type 310 define the set of sparse sampling coordinates located within elements of grid 304. The total number of grid elements defined by grid 304 determine the size of the array (e.g., 1024×1024, 2048×2048, 4096×4096, 8192×8192) and the corresponding step size expressed in terms of signal amplitude or a resolution spacing.

Figure 4:
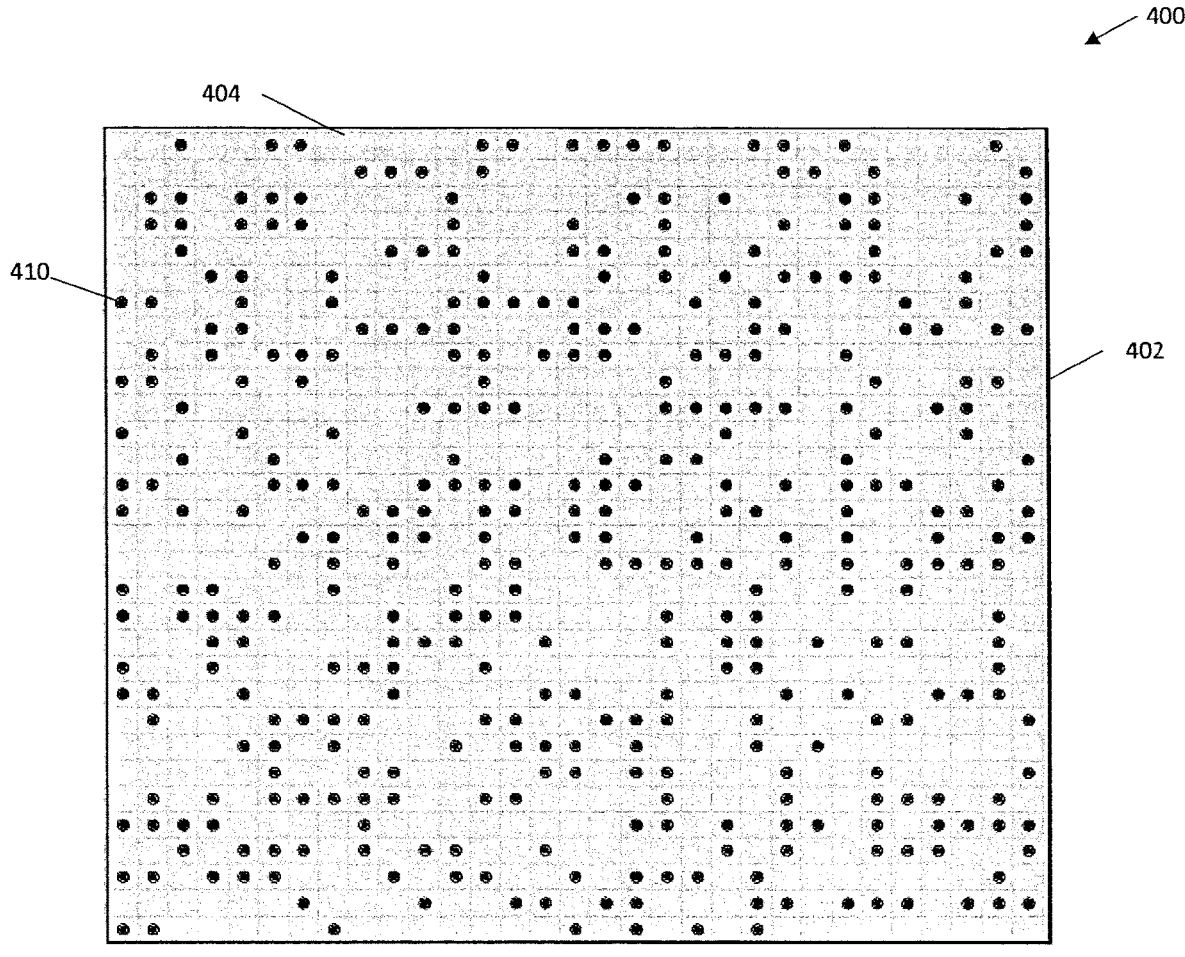
FIG. 4 is a graphical representation of one embodiment of discrete sparse sampling coordinates (circular markers) derived from the primary carrier signal represented in FIG. 2 and the randomized modulating secondary signal pattern represented in FIG. 3.

FIG. 4 is graphical representation 400 of one embodiment of discrete sparse sampling coordinates and represented by the circular markers 410 with scan boundary 402 and scan grid array 404. The collection of points 410 represent the aggregate sum of the primary carrier path 206 in FIG. 2 and the randomized secondary modulating signal path 308 in FIG. 3. Each circular marker 410 in FIG. 4 represents a sparse sampling element with programmable dwell time. By choosing a different random seed, or by choosing a different randomizing algorithm, the same primary carrier signal path (e.g., Hilbert style space-filling path in FIG. 2) can produce a different set of sparse sampling coordinates with the same, or different, degree of sparsity. The degree of sparsity may be regulated from 0% to greater than 99% in fractional percent sparsity increments through the approach of this disclosure. The distribution of work conveyed to the scanning probe through the action of a primary carrier signal path relative to a secondary modulating pattern may be regulated by adjusting the scale of the primary carrier pattern, in conjunction with the maximum signal amplitude permitted by the secondary modulating signal. For example, in one embodiment of sparse sampling system 108, the primary carrier signal has a signal amplitude of ±10V while the maximum amplitude of the secondary modulating signal is ±3 mV. In this embodiment, the secondary modulating signal may deviate up to ±3 mV relative to the concurrent position of the primary carrier signal to which it is referenced. If the maximum permitted secondary modulating signal is ±0.5V, then the secondary modulating signal can contribute a larger fraction of the work to construct the same sparse sampling pattern. The signal amplitude voltage corresponds to a physical deflection on the scanning probe instrument 104, a motion of the stage, or both. Varying the maximum secondary modulating signal amplitude, as referenced to the primary carrier signal, and regulating the maximum rate of change of both the primary carrier and secondary modulating signals, allows the sampling rate of the sparse sampling scanning probe system 100 to be varied to mitigate scanning artifacts including, but not limited to, slew, distortion and hysteresis.

Figure 5:
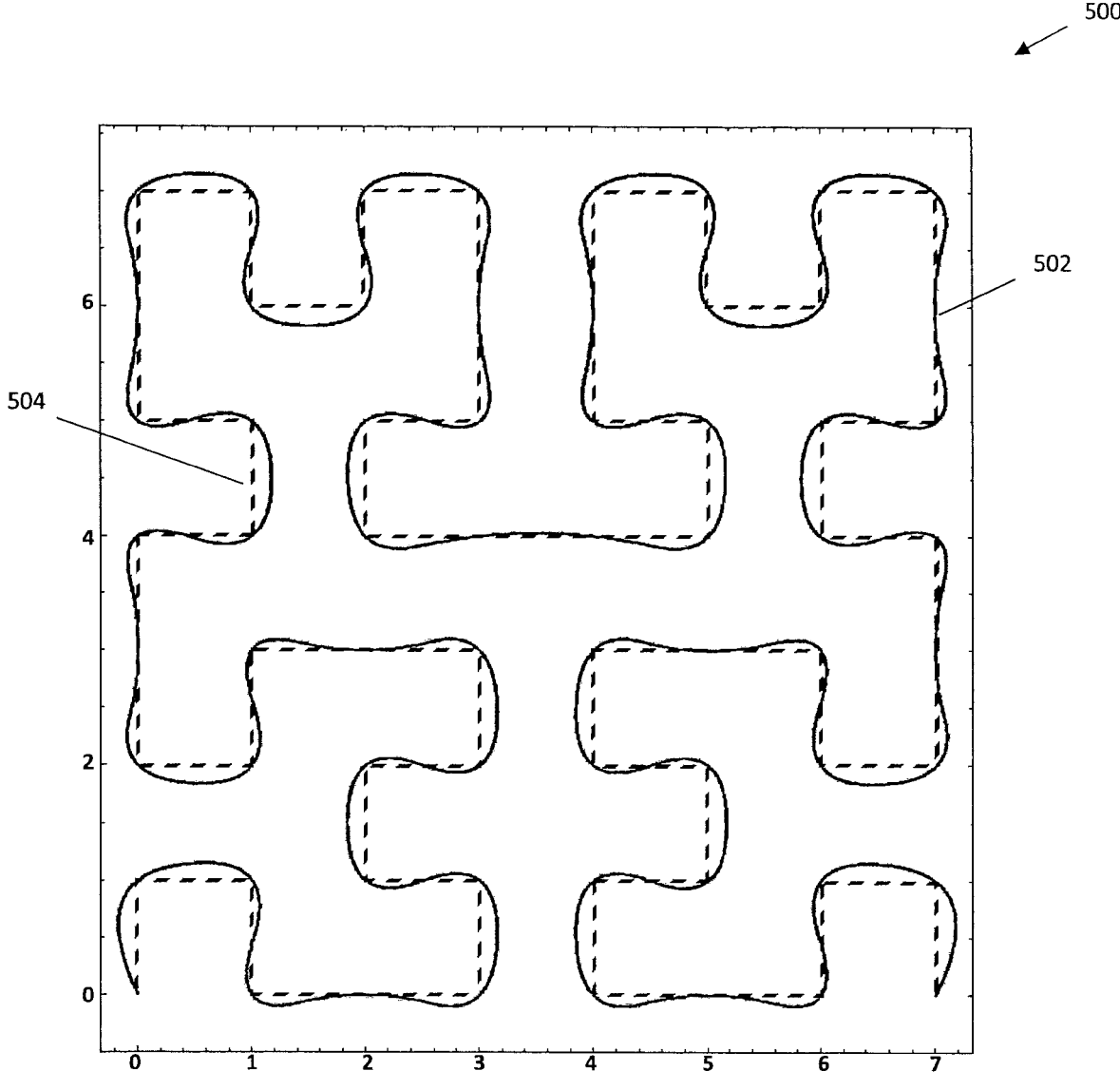
FIG. 5 is a graphical representation of a smoothed Hilbert style space-filling curve path 502, superimposed upon unsmoothed Hilbert style space-filling curve path 504.

A large number of variants are possible in the design of a suitable primary carrier signal path. FIG. 5 is graphical representation 500, of a smoothed Hilbert style space-filling curve path 502, superimposed upon unsmoothed Hilbert style space-filling curve path 504. The smoothing operation on the smoothed Hilbert style space-filling curve path 502 represents one variant of a previously described topological curve which may be employed in the embodiments of sparse sampling system 108. In one embodiment of the sparse sampling system 108, the sparse sampling pattern generator 119 may be programmed to construct primary carrier patterns which are subsequently smoothed or otherwise modified versions of topological curves and space-filling curves constituting all or part of the primary carrier signals conveyed through to the scanning probe instrument scan inputs 106 in order to regulate the resulting rate of change of the X-Y or X-Y-Z pattern. Regulating the rate-of-change of the primary carrier pattern is one means to mitigate scanning artifacts such as, but not limited to slew, distortion and hysteresis.

Figure 6:
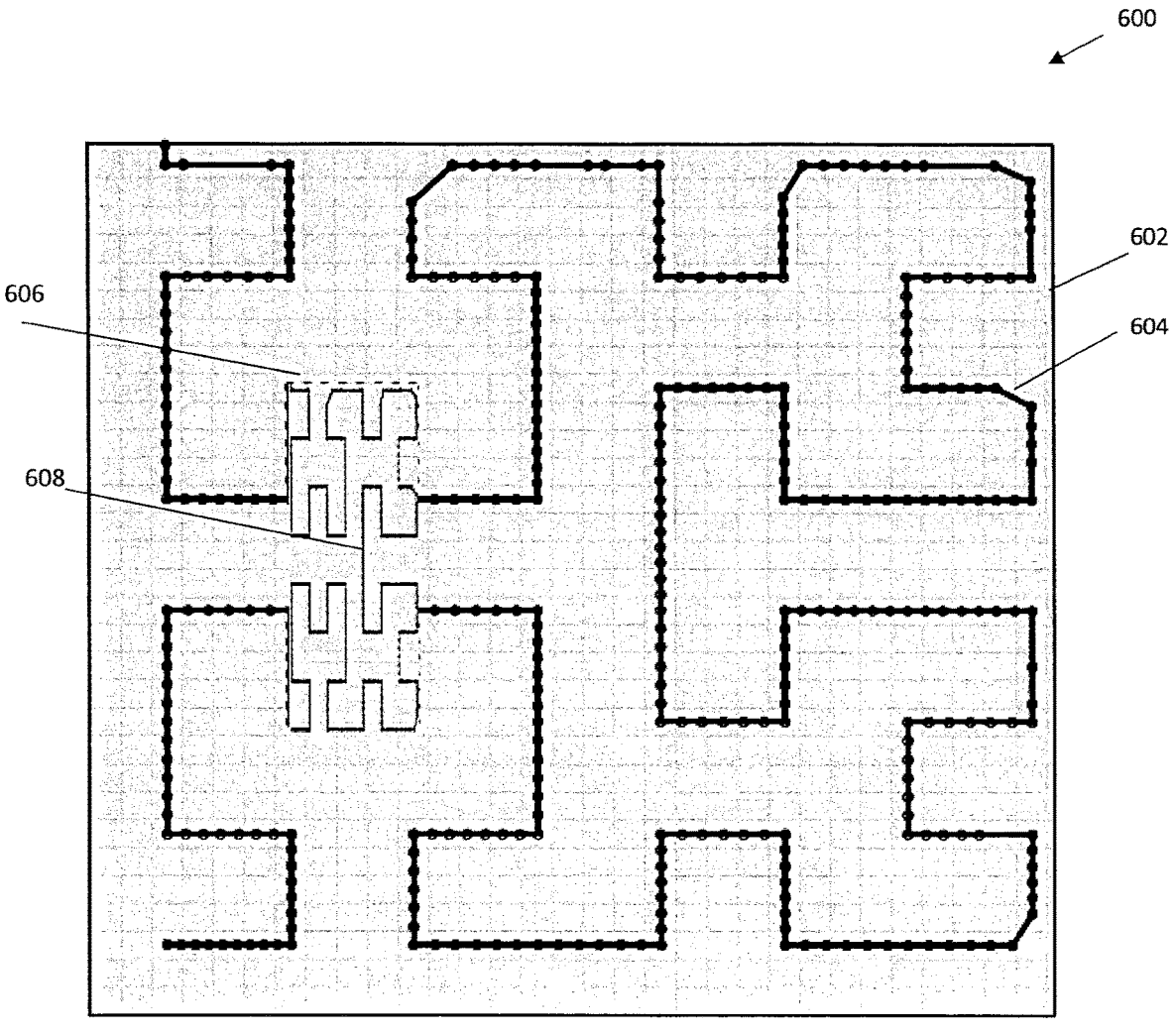
FIG. 6 is a graphical representation including a scan boundary encompassing a primary carrier signal path and a region of interest (ROI) containing a primary carrier signal path which is scaled relative to primary carrier path.

An embodiment of the sparse sampling system 108 utilizes sparse sample pattern generator 119 to implement a signal pattern which contains regions of interest (ROIs) with varying sparsity and/or scan grid spacing within a scan boundary. FIG. 6 is graphical representation 600 including a scan boundary 602 encompassing a primary carrier signal path 604 and a ROI 606 containing a primary carrier signal path 608 which is scaled relative to primary carrier path 604. ROI 606 could represent a region related to geometric boundaries wherein a different sample sparsity was desired and/or a different scan grid spacing was desired (e.g., higher pixel density within ROI 606). A plurality of ROIs may exist within one scan boundary 602. Graphical representation 600 depicts ROI 606 as enclosing a primary carrier signal path 608 constructed using a non-uniformly scaled version of primary carrier signal path 604, as a simplified visualization. However, primary carrier signal path 608 could be constructed from any suitable type of carrier signal path.

Figure 7:
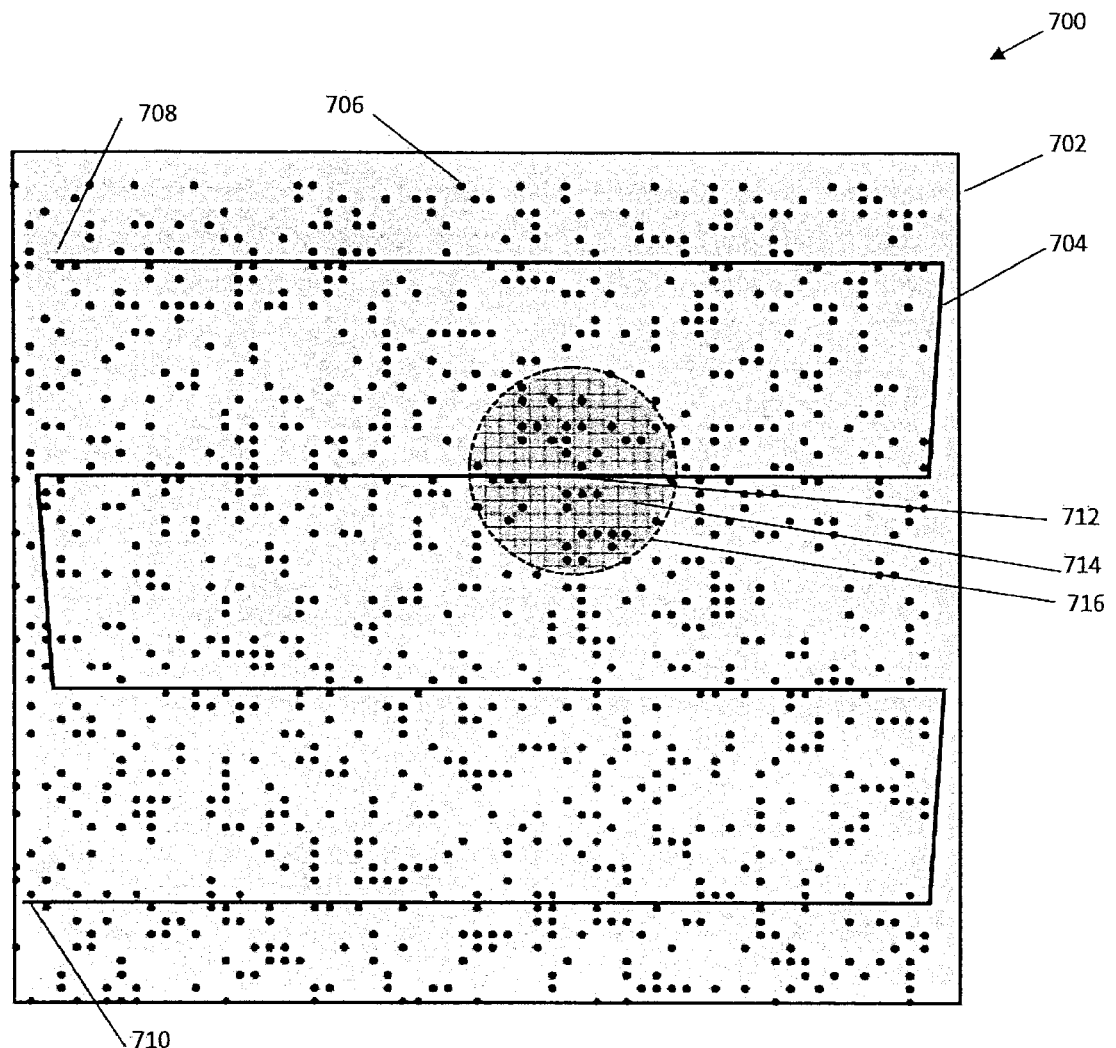
FIG. 7 is a graphical representation consisting of an X-Y sparse sampling embodiment including a scan boundary, serpentine style primary carrier signal path and a set of randomized sparse sample points defined by the set of plot marker type.

FIG. 7 is a graphical representation 700 consisting of X-Y sparse sampling embodiment including scan boundary 702, serpentine style primary carrier signal path 704 and a set of randomized sparse sample points defined by the set of plot marker type 706. Graphical representation 700 is useful to illustrate basic features common to the sparse sampling system 108. In this example, primary carrier signal path 704 initiates from location 708, transverses along primary carrier signal path 704 and completes at location 710. X-Y coordinate 712 represents an arbitrary coordinate along the primary carrier signal path 704. The area within circular boundary 716 represents the maximum amplitude of the X-Y secondary modulating signal (not shown), which is referenced to the primary carrier X-Y coordinate 712 located at the geometric center of circular boundary 716 along primary carrier signal path 704. Sparse sample coordinates may be randomly created within any element of sample grid 714 located within circular boundary 716. The current graphical representation 700 consists of a two-dimensional X-Y sparse sampling embodiment and therefore, the sparse sampling system 108 allows two degrees of freedom in defining the possible sparse sample locations within circular area 714. Given a three-dimensional X-Y-Z embodiment of the sparse sampling system 108, the analogous representation of the two-dimensional circular area 714 would be a three-dimensional sphere (not shown). In the case of a three-dimensional X-Y-Z embodiment of sparse sampling system 108, there are three degrees of freedom in defining the random sparse sampling scan coordinate location. The degrees of freedom afforded by the sparse sampling system 108 to define sparse sampling coordinates is a significant distinction, as compared to other proposed spare sampling systems.

Further, graphical representation 700 serves to illustrate that an embodiment of sparse sampling system 108 operates given an initial set sparse sample coordinates, such as the set of randomized sparse sample points defined by the set of coordinates coincident with marker type 706. In an embodiment wherein sparse sampling coordinates are given initially, the sparse sampling pattern generator 119 constructs primary carrier signal path 704 and secondary modulating pattern to fit the a-priori set of sparse sampling coordinates.

An identical set of sparse sample coordinates coincident with the set of plot marker type 706 in graphical representation 700 may be generated by sparse sampling system 108 using a variety of primary carrier signal paths. In one embodiment of the sparse sampling system 108, a Hilbert style primary carrier signal path is used to generate an identical set sparse sample coordinate coincident with the set of plot marker type 706 in graphical representation 700 produced using serpentine primary carrier signal path 704. Another very simple alternative primary carrier signal carrier embodiment to produce an identical set of sparse sample coordinates coincident with the set of plot marker type 706 in graphical representation 700 is represented by a clockwise or counter clockwise ninety-degree rotation of primary carrier signal path 704.

A purpose to invoke a specific primary carrier signal path satisfying a given set of sparse sampling coordinates includes, but is not limited to, mitigation of scanning artifacts related to sample charging, where object 102 is either insulative or semi-conducting. Both the primary carrier signal path and the degree of sparsity influence sample charging in a charged particle scanning probe instrument and may be tuned using sparse sampling system 108.

Figure 8:
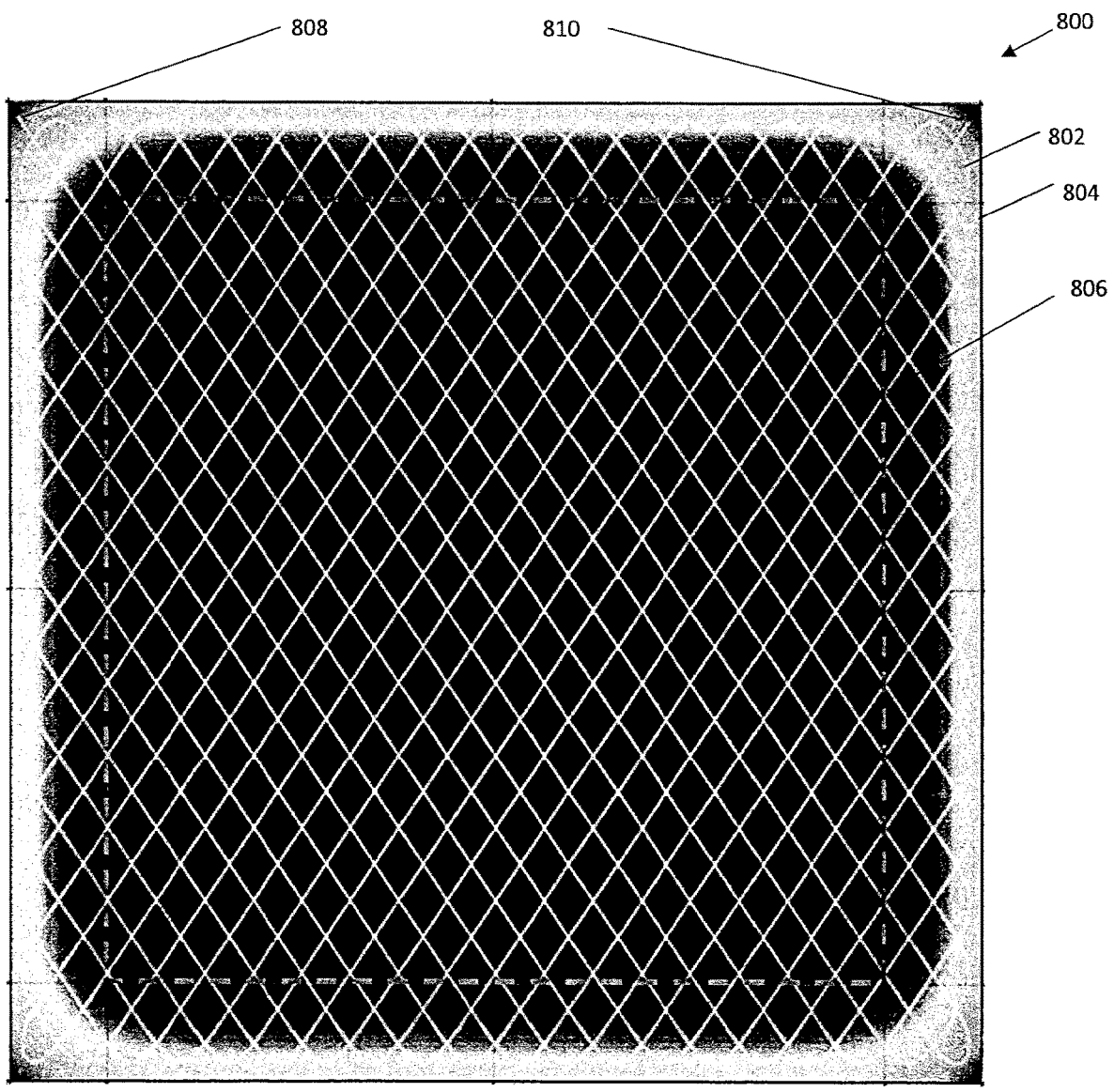
FIG. 8 is a graphical representation of a continuous X-Y parametric equation to generate primary carrier signal path.

One embodiment of sparse sampling system 108 utilizes carrier signal paths created from a sequential set list of X-Y or X-Y-Z coordinates, including a set of X-Y or X-Y-Z coordinates generated by parametric equations. FIG. 8 is graphical representation 800 of a continuous X-Y parametric equation to generate primary carrier signal path 802. Over-scan boundary 804 encompasses the entire scan area, and object scan boundary 806 (dotted line) represents a sub-region of the primary carrier signal path 802. It is common practice for pattern generators employed in scanning probe instruments to incorporate an over-scan region defined by the area between the over-scan boundary 804 and the object scan boundary 806, the purpose of which is to exclude regions where the scan pattern may be non-ideal for reasons including, but not limited to, non-linear scan behavior and non-uniform area coverage. The region within the object scan boundary 806 represents a region of higher uniformity relative to the region between the over-scan boundary 804 and the object scan boundary 806. The primary carrier signal path 802 in representation 800 initiates at X-Y coordinate 808, follows continuous primary carrier signal path 802 and terminates at X-Y coordinate 810. A particular X-Y parametric equation embodiment to generate space-filling carrier signal path 802 is a smoothed form of the parametric equation 1:

$$X = A_x x \left| 2\left(\frac{t}{a}\right) - \text{floor}\left(\frac{t}{a} + \frac{1}{2}\right) - 1 \right|; \qquad \text{Equation 1}$$

$$Y = A_y x \left| 2\left(\frac{t}{b}\right) - \text{floor}\left(\frac{t}{b} + \frac{1}{2}\right) - 1 \right|$$

where, $A_x$ and $A_y$ define the maximum signal amplitudes for X and Y dimensions respectively. The vertical brackets indicate the absolute value of the quantity enclosed. Variable $\underline{t}$, is a time increment parameter, $\underline{a}$ is the X frequency of the primary carrier signal, $\underline{b}$ is the Y frequency of the primary carrier signal and $\underline{\text{floor}}$ is a mathematical function which takes as input a real number $\underline{R}$, and gives as output the greatest integer less than or equal to $\underline{R}$. A large family of X-Y and X-Y-Z parametric equations may be utilized by sparse sampling system 108 in order to produce suitable primary carrier signal paths. Lissajous curves represent yet another particular common family of parametric curves which can be explored as primary carrier signal paths.

In an embodiment of sparse sampling system 108 employing a continuous space-filling type path, beam blanking may not be required along the scan path, or along parts of the scan path. Beam blanking is a common element in charged particle systems which provides a means to extinguish, or "blank", the probe interaction with the object. Typically, in charged particle instruments a beam blanking component may include electrostatic deflection plates near the top of the column proximal to a crossover position in the optical path. Action of the beam blanking deflects the probe (beam) into a position which prevents the probe (beam) from transmitting through the optical path to interact with the object. High-speed beam blanking elements are typical options available in a charged particle embodiment of scanning probe instrument 104 which allow more rapid beam blanking, corresponding to higher resolution definition of the dwell time at each scan coordinate. In another embodiment of sparse sampling system 108 employing one or more discrete or continuous primary carrier signal paths, beam blanking may be utilized as desired to mitigate scan artifacts and spurious probe interactions with object 102.

A large variety of suitable space-filling carrier signals may be utilized by sparse sampling system 108. Carrier signal patterns may be programmed to generate any combination of: a continuous and non-overlapping pattern; a continuous and non-intersecting pattern; a continuous and intersecting pattern; or a continuous and overlapping pattern. Sparse sampling system 108 may utilize carrier signal patterns programmed as discrete segments with arbitrary discontinuity. For example, this approach could be applied to trace and/or fill a plurality of separate, geometric regions or spatial features of the object being sensed. A particular example is a carrier signal path and referenced modulating signal path designed to produce a set of sparse sampling coordinates which trace the path incorporating a neuron in a biological matrix. Similarly, a rectangular, triangular, circular or other geometric pattern on the object being sensed could represent the sparsely sampled domain.

Sparse sampling system 108 may utilize carrier signal patterns constructed from analytical space-filling curves programmatically modified to adjust the aggregate sparse sampling pattern, and/or the performance of the pattern generator, and/or the interaction with the scanning analytical system. For example, the transmitted carrier signal patterns and referenced secondary modulating signal patterns may be smoothed by software mathematically or by hardware to limit the rate-of-change of the signals in order to not exceed the performance limitations of the scanning probe system in order to avoid scanning artifacts.

Figure 9:
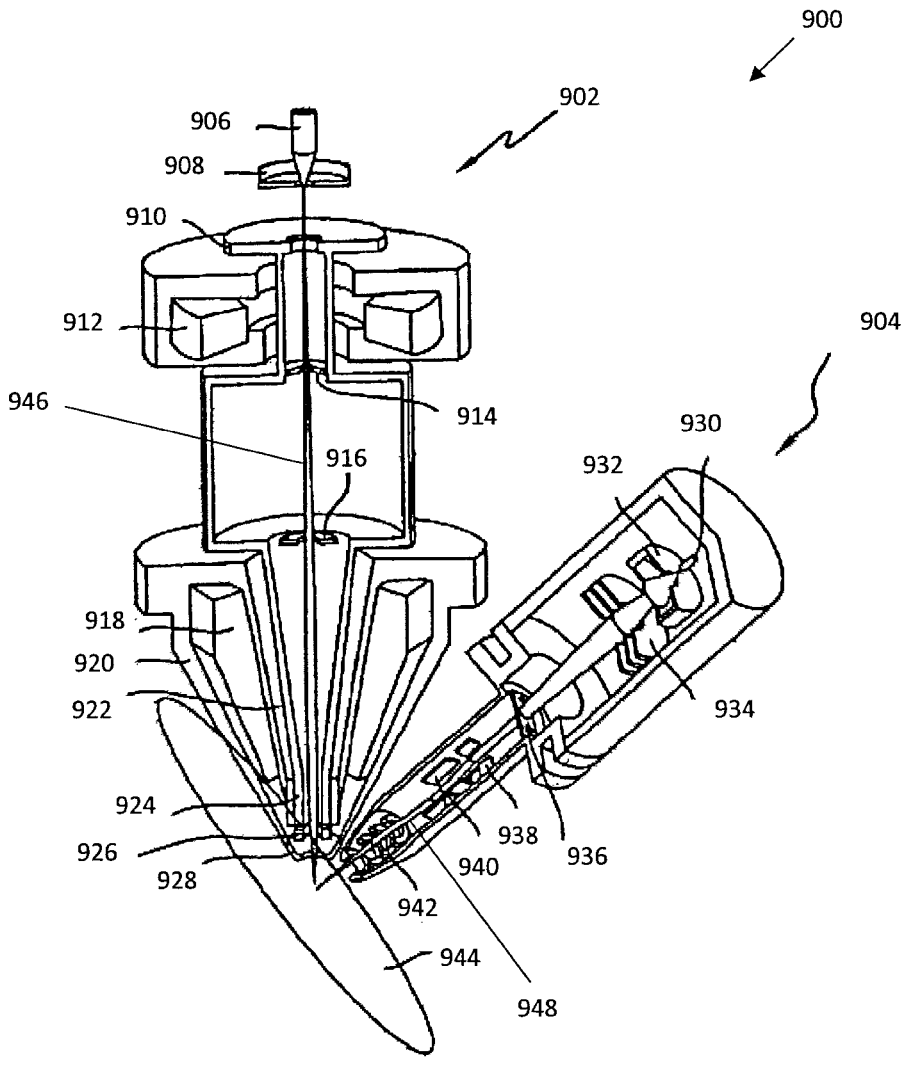
FIG. 9 is a diagrammatic illustration of a dual column scanning probe instrument in which at least some of the embodiments of the disclosure may be included.

FIG. 9 is diagrammatic illustration 900 of a dual column scanning probe instrument in which at least some of the embodiments of the disclosure may be included. Scanning electron beam column 902 and focused ion beam column 904 are oriented such that a coincidence region exists between the scan areas of electron beam 946 and ion beam 948. Object 944 surface area is depicted as orthogonal to ion beam 948. In one embodiment, object 944 is affixed to a moveable stage (not shown) that allows X-Y-Z as well as rotation and tilt stage motion with range sufficient to orient object 944 surface area orthogonal to electron beam 946 or ion beam 948. The scanning electron beam column 902 depicted includes an electron source 906, extraction electrode 908, anode 910, electromagnetic collimating lens system 912, spray aperture 914, in-lens object response signal detector 916, electromagnetic lens coil body 918, outer pole piece 920, inner pole piece 922, electrostatic objective lens electrodes 924 and 928, and scanning probe coils 926. The focused ion column 904 includes an ion source 930, extraction electrode 932, condenser lens 934, variable aperture 936, electrostatic deflection electrodes 938 and 940, and objective lens 942.

One embodiment of the sparse sampling system 108 of FIG. 1 is configured with at least two pair of X-Y compound signal converters 110 to simultaneously drive the scan coils 926 of scanning electron column 902 and scan deflection electrodes 938 and 940 of focused ion column 904. One embodiment of the sparse sampling system 108 includes an object response detector 126 configured as a secondary ion detector and an object response detector 126 configured as a backscatter electron detector which operate simultaneously and concurrently with sparse sampling system 108. Additional object response detectors 126 in dual column scanning probe instrument 900 may include, but not be limited to, in-lens secondary electron detectors, in-chamber secondary electron detectors, in-chamber backscatter detectors, secondary ion conversion detectors, fluorescence detectors, x-ray detectors, time-of-flight secondary ion mass spectrometers, electrostatic-electromagnetic mass spectrometers, and quadrupole mass spectrometers.

In one embodiment of the sparse sampling system 108, a plurality of X-Y discrete layers or thin sections of the object being probed are sparsely sampled. The sparse sampling positions from each layer are programmatically randomized to produce a sparse sampling volume randomized in three dimensions, X-Y-Z. For example, sparse sampling system 108 drives the scan deflection electrodes 938 and 940 to produce an ion milling process by focused ion column 904 to expose a fresh object 944 surface layer (e.g., also could be termed a slice or section defined by the interaction volume of the probe and object). Sparse sampling system 108 drives electron beam column 902 concurrent with, or subsequent to, the ion milling process to acquire a sparse sampling amalgamate representation of the fresh object 944 surface region using one or more object response detectors 126 and wherein each sparse sampling X-Y scan has a unique randomized sparse sampling pattern. The process of using sparse sampling system 108 to generate a fresh surface with ion beam column 904 and acquire a sparse sampling with electron beam column 902 is repeated to generate a stack of X-Y amalgamate representations produced by image reconstruction system 120. In this embodiment, the sparse sampling is extended from two dimensions into three dimensions and the maximum percentage of sparsity allowed for successful image reconstruction system 120 is much higher than the maximum sparsity allowed for a corresponding two-dimensional individual layer. For example, if 90% sparsity is the maximum sparsity which produces an acceptable amalgamate representation using image reconstruction system 120 for each individual X-Y scan layer; 97% or greater sparsity may produce an acceptable amalgamate representation using image reconstruction system 120 from the same X-Y scan layers when processed as a randomized three-dimensional X-Y-Z stack. Each depth layer signal pattern includes a programmatically unique randomized X-Y sparse sampling pattern in order to optimize the sparse sampling processed by image reconstruction system 120 as X—Y—Z layer stack to yield an amalgamate reconstruction with higher sparsity than can be obtained from each layer individually.

In one embodiment of sparse sampling system 108, the sparse sampling operation may be repeated successively over the same area using either an identical sparse sampling pattern generated from 119 for each successive scan, or using a uniquely randomized pattern generated from 119 for each successive scan pattern, or any combination thereof. This embodiment is utilized, for example, to acquire successive X-Y scans during continuous or semi-continuous sensing of the object 102 being sparsely sampled.

In one particular embodiment of sparse sampling system 108, the entire sparse sampling process from sparse sampling pattern generator 119 through to image reconstruction system 120 operates successively and repeatedly as rapidly as combined systems permit. Alternatively, the entire sparse sampling system 108 operates with discrete time delay. Highest possible operation rate of sparse sampling system 108, or discrete delay operation of sparse sampling system 108, may be used to continuously, or semi-continuously, observe the object 102 while it is being sparsely sampled. Observations of the object 102 being sparsely sampled may include, but not be limited to, changes due to mechanical movement of all or part of the object being sensed (e.g., a clockwork or gear motion), modifications induced through the action of a separate probe (e.g., micromanipulator, laser ablation, focused ion beam, or broad beam ion milling), changes induced by an energy source (e.g., heating, cooling), changes due to chemical interaction with all or part of the object being sensed, or any combination thereof. The benefits of sparse sampling observation of object 102 during such changes include reduced sensing probe interactions with the object 102 being sensed (e.g., reduced electron dose, reduced sample charging), and increased object response detector 126 signal acquisition rate during near real-time observation.

Successive object response signal detector 126 patterns conveyed through the object response signal converter(s) 122 during sparse sampling observation of object 102 are utilized in one embodiment of sparse sampling system 108 to reconstruct amalgamate representations through image reconstruction system 120 to provide a record of change over the observation period. For example, image reconstructions resulting from observations while object 102 is ion milled or mechanically deformed form a three-dimensional volumetric representation from a stack of reconstructed X-Y amalgamate representations. Alternatively, image reconstruction system 120 may produce a single X-Y-Z volumetric amalgamate representation from either the entire three-dimensional sparse data array, or from one or more three-dimensional array sparse data blocks consisting of subsets of the entire sparse data array. An example embodiment is a tomographic reconstruction of a volume based upon a three-dimensional array of sparse sample data wherein the object response detector 126 is a back-scattered electron detector used to acquire sparse sample object response signal converter 122 data obtained from either sequential focused ion beam milling, or during concurrent focused ion beam milling, to generate volumetric object 102 response signal image data.

In one embodiment of sparse sampling system 108, the sparse sampling percentage is adapted to reflect changes in the object 102 geometry or material property during observation.

One embodiment of the sparse sampling system 108 utilizes a carrier signal path, a referenced set of modulating signal coordinates and a degree sparsity to suit analytical objectives based upon data from the object response detector 126 signals induced from object 102 being sparsely sensed. Analytical objectives may include, but not be limited to, the response signal intensity (e.g., adjusting dwell time) and/or the response signal spatial resolution (e.g., adjusting sparsity).

In one embodiment of the sparse sampling system 108, encoding and indexing of the ADC signal data synchronized through the programmable logic controller may be compressed relative to the full sample signal data to save significant digital storage memory by storing data in an ordered list, rather than as an object array.

In one embodiment of the sparse sampling system 108, object response signal converter 122 signals conveyed by the object response detector 126 signals induced from the object 102 being sparsely sensed is used to compute a fast Fourier transform (FFT) from the amalgamate representation from the image reconstruction system 120. In a further embodiment of the sparse sampling system 108, the FFT computed from the amalgamate representation is utilized in an automated focus and/or an automated astigmatism correction method.

One embodiment of sparse sampling system 108 produces X-Y scan patterns driving the scan deflection electrodes 938 and 940 of focused ion beam column 904 with a sparsity corresponding to an ion dose at or below the static Secondary Ion Mass Spectroscopy limit.

In one embodiment of the sparse sampling system 108, sparse sampling pattern generator 119 incorporates scan distortion corrections to correct scan distortion errors intrinsic to both the scanning probe instrument and the sparse sampling system 108. Scan distortion errors resulting from both the scanning probe instrument and the sparse sampling system 108 are measured using suitable geometric reference standards. Measured scan distortion error corrections are mapped back to sparse sampling pattern generator 119 to generate signal patterns with minimal scan distortion. Scan distortion errors exhibited by a particular scanning probe instrument 104 and sparse sampling system 119 may be compensated in this manner such that corrected scans are output by the sampling scan pattern generator 119. A-priori distortion correction as described obviates post-process correction of reconstructed amalgamate representations of object 102.

An embodiment of sparse sampling system 108 includes a point spread function deconvolution (PSFD) operation as part of image reconstruction system 120 to combinate sparse sampling reconstruction and PSFD. In this embodiment the spatial resolution of the amalgamate representation is improved by inclusion of the PSFD operation and wherein the PSF is a measured or theoretical function corresponding to scanning probe instrument 102.

The description provided above in connection with FIGS. 1-9 primarily relates to programmable X-Y scan pattern generation. However, as briefly described earlier, the principles of the disclosure also apply to programmable X-Y-Z scan pattern generation. Embodiments related to programmable X-Y-Z scan pattern generation are described in detail below.

In one embodiment, the sparse sampling system 108 of FIG. 1 is configured as an X-Y-Z pattern generator, in which the Z-coordinate of the scan pattern coordinates of an object scan for each X-Y-Z set of coordinates may be defined through the action of a set of rules with the following form: i) The Z-coordinate defined by a third programmable primary carrier signal and a third secondary programmable signal that modulates the third primary carrier signal through a third randomized modulation, such as a modulation along the carrier signal path of a three-dimensional space-filling curve, with a particular carrier signal path example being a three-dimensional Hilbert space-filling curve 1200 as graphically represented in FIGS. 12A-12D; ii) the Z-coordinates of the set of scan pattern coordinates on the object scan region defined as discretized on at least two pre-defined Z-plane coordinates, as graphically represented in FIGS. 10A-10D; iii) the Z-coordinate scan pattern coordinate for each X-Y-Z set of scan pattern coordinates of an object scan 1100, defined by a randomized modulation from the Z-coordinates lying on the at least two pre-defined Z planes in the positive or negative Z-direction, as graphically represented in FIGS. 11A-11D; iv) the Z-position is randomly distributed in the positive or negative Z-direction for each X-Y-Z set of scan pattern coordinates of an object scan.

Repeated from above; the sparse sampling system compound signal converter 110 is extensible to "N" number of signal converter elements. For example, compound signal converter 110 includes a primary, secondary and tertiary signal converter elements. The sparse sampling system 108 is extensible as a triad of compound signal converters to configure an X-Y-Z pattern generator. Configuration of the X-Y-Z pattern generator in the context of this disclosure further indicates that sparse sampling system 108 has the ability to generate signals through sparse sampling pattern generator 119, and transmit the pre-defined coordinated signals through controller 116 to scan inputs 106 of a scanning probe instrument 104 to coordinate and control object scan signals corresponding to the X-direction, Y-direction and Z-direction of scanning probe instrument 104 using, for example, a rectangular frame of reference. In general, as noted earlier, sparse sampling system 108 incorporates a controller 116 (e.g., FPGA) which stores the set of transmitted signals produced by sparse sampling pattern generator 119 and coordinates the sequenced transmission of the output signals for the X-direction, Y-direction and Z-direction through appropriate X-direction, Y-direction and Z-direction signal converters (e.g., DACs) to the scan inputs 106 of the scanning probe instrument. It should be noted, embodiments of this disclosure could equivalently be expressed in polar and/or spherical coordinates.

Embodiments of the disclosure for a sparse sampling system 108 configured as an X-Y-Z pattern generator describes specific ways in which the Z-coordinate may be invoked to define a three-dimensional sparse, or fractional, sub-sampling pattern, according to the set of Rule i) through Rule iv). Rule i) is an extension of the X-Y modulation of a two-dimensional space-filling curve into the X-Y-Z modulation along the path of a three-dimensional space-filling curve. Rule ii) discretizes the Z-coordinate location, which mitigates scanning artifacts, but may result in a less random sparse sampling matrix relative to Rule i). Rule iii) combines discrete planes with modulation about each plane, resulting in mitigation of scanning artifacts while producing an improved statistical randomness in the sparse sampling matrix, relative to Rule ii). Rule iv) is the most general, wherein the Z-coordinate is defined by a randomized value within the range of the Z-direction of an object scan. However, in a real physical system, invoking Rule iv) may restrict the range of the Z-direction random modulation to mitigate scan artifacts. Further, random values extracted from the entire possible range of Z-coordinate values can result in both large and small deviations from the prior Z-coordinate. Large deviations in sequential Z-coordinate values may exacerbate artifacts related to dynamic systems, such as slew and hysteresis, while limiting the dynamic response of the system. By invoking a random modulation scheme either about discrete planes, according to Rule iii), or a random modulation along a three-dimensional space-filling path, according to Rule i), the Z-coordinate has a random condition localized to a plane or a three-dimensional path defined by the extent of the modulation parameter.

Figures 12A, 12B, 12C, 12D:
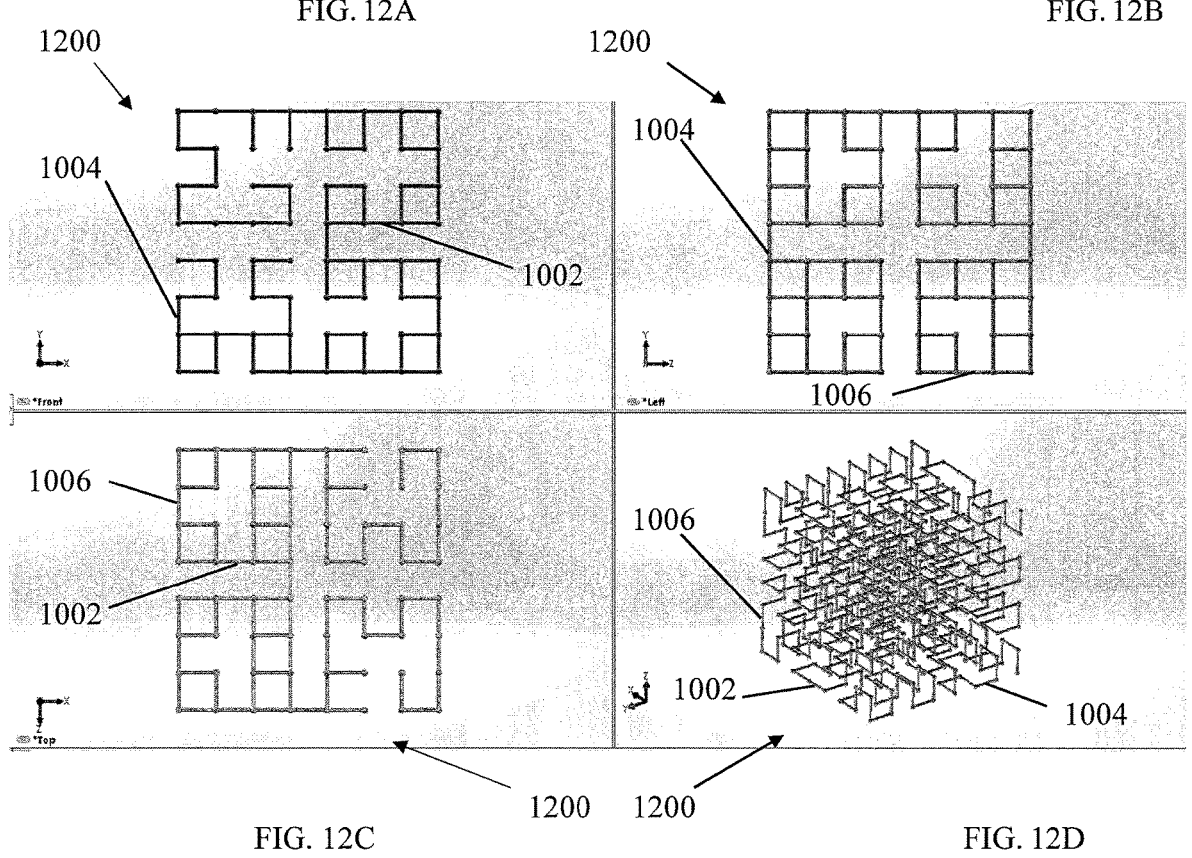
FIGS. 12A-12D are graphical representations of a three-dimensional Hilbert space-filling curve representing one type of three-dimensional space-filling curve in which Z-coordinates are defined by a predetermined rule in accordance with yet another embodiment.

The form of Rule i) generates a carrier-modulator signal pair for the Z-coordinate in the same fashion as applied to generate the carrier-modulator signal pairs for the X-Y coordinates in the embodiment of the sparse sample system 108 configured as an X-Y two-dimensional pattern generator. This embodiment extends modulation along an X-Y space-filling curve carrier signal to modulation of X-Y-Z carrier signals along a three-dimensional space-filling curve, as graphically represented in FIG. 12A-12D. FIG. 12A is a view of object scan 1200, along the Z direction 1006 (labeled in FIG. 12B). FIG. 12B is a view of object scan 1200, along the X-direction 1002 (labeled in FIG. 12A). FIG. 12C is a view of object scan 1200 along the Y-direction 1004 (labeled in FIG. 12A), and FIG. 12D is a trimetric X-Y-Z perspective view of object scan 1200. Carrier signals are not explicitly coincident with any coordinate of an object scan, but an object scan coordinate may randomly be coincident with one or more components of the carrier signal. The carrier signal may be generally thought of as a guiding center which determines how the scanning probe moves through an object scan domain, and about which randomized modulations are generated.

In one embodiment of Rule i), one or more continuous portions of a three-dimensional space-filling curve of an object scan are sub-divided into two or more three-dimensional sub-regions. Random modulations along the continuous portion of the three-dimensional space-filling curve are generated within each sub-region. In general, each sub-region of an object scan may be generated with a different degree of sparsity. The ability to pre-define a unique degree of sparsity in each sub-region represents an adaptive strategy to adjust the sparse, or fractional, sub-sampling distribution of an object scan. However, for an object scan with uniform sparsity throughout the object scan domain, the degree of sparsity generated in each pre-defined sub-region is the same in each sub-region. A benefit of sub-dividing an object scan into two or more sub-regions, even when the sparsity is the same in each sub-region, is to condition the local randomness of the sparse, or fractional, sub-sampling signals defined by sparse sampling pattern generator 119. The subdivisions may be rectilinear, non-rectilinear or irregularly shaped.

Within each sub-division, the random generator seed may be fixed or random. A random generator initialized with the same fixed seed to modulate carrier signal components of an object scan will reproduce the same randomized sparse coordinates given the same carrier signal space-filling curve (e.g., 2D Hilbert), the same object scan dimensions (the scan pattern of an object scan has the same deflections or physical dimensions mapped to the object scan in each direction), the same size and shape sub-regions, the same number of addressable picture elements in each sub-region (e.g., 4096× 4096), and the same degree of sparsity in each sub-region (e.g., 80%).

In one embodiment of this disclosure wherein random modulation of an object scan carrier signal is sub-divided into two or more sub-regions, a fixed seed determines the initial value of a random generator sequence.

In one embodiment of this disclosure a random generator initialized with a random seed to modulate carrier signal components produces an object scan with an unrepeated set of randomized sparse coordinates, even given the same carrier signal space-filling curve, the same object scan dimensions, the same size and shape sub-regions, the same number of addressable picture elements in each sub-region, and the same degree of sparsity in each sub-region (e.g., 80%).

In one embodiment of this disclosure wherein random modulation of an object scan carrier signal is sub-divided into two or more sub-regions, a random seed determines the initial value of a random generator sequence.

Figures 10A, 10B, 10C, 10D:
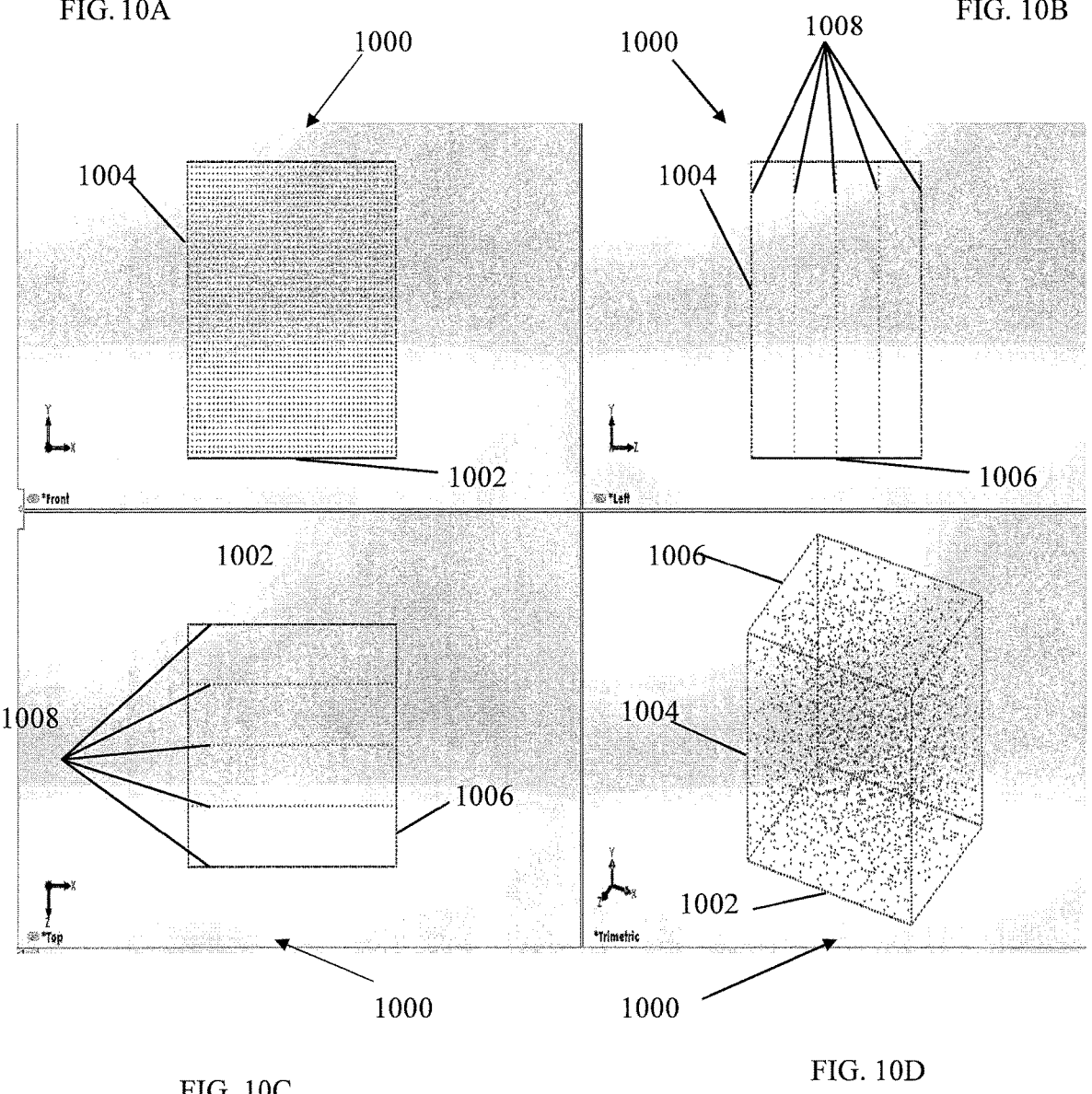
FIGS. 10A-10D are graphical representations of X-Y-Z sparse, or fractional, sub-sampling of a scan object in which Z-coordinates are defined through the action of predetermined rules in accordance with one embodiment.

The form of Rule ii) generates a fixed pre-determined set of Z-planes, as graphically represented in FIG. 10A-10D. FIG. 10A is a view of object scan 1000, along the Z direction 1006 (labeled in FIG. 10B). FIG. 10B is a view of object scan 1000, along the X-direction 1002 (labeled in FIG. 10A). FIG. 10C is a view of object scan 1000 along the Y-direction 1004 (labeled in FIG. 10A), and FIG. 10D is a trimetric X-Y-Z perspective view of object scan 1000. The volume of object scan 1000 is defined by the dimensions in the X-direction 1002, Y-direction 1004 and Z-direction 1006. In the embodiment represented in FIGS. 10A-10D, 80% sparsity is discretely distributed in each of five Z-planes 1008, with two of the five planes overlapping the object scan boundaries. In one embodiment, each Z-plane 1008 in FIG. 10 represents a 50×50 array of addressable picture elements, of which 20% of the addressable picture elements in the 50×50 array are sub-sampled on each Z-plane 1008.

The minimum and maximum object scan dimensions will depend, in part, upon the scanning probe instrument. For example, a common standard for the X-Y object scan range on a SEM or scanning transmission electron microscope (STEM) corresponds to ±10 Volts transmitted to analog inputs of scan deflection coils through circuitry associated with a magnification range. The voltage signals could correspond to more than several millimeters or sub-micron physical dimensions on an object, according to the voltage magnitude. The discrete Z-plane in the case of a SEM/STEM could be actioned, for example, by transmitting the Z-coordinate generated by sparse sampling pattern generator 119 to the input to an objective lens component of Scanning probe instrument 104 coordinated through Controller 116, to set a focal distance to a value corresponding to a physical Z-plane of an object scan. However, a scanning probe instrument could be configured to utilize a static probe (e.g., laser probe) coupled to an X-Y-Z stage to generate an object scan.

Expressed in generalized terms; the predetermined Rule ii) comprises the Z-coordinates of the set of scan pattern coordinates of the object scan defined as discretized on at least two pre-defined Z-planes, such that different non-overlapping subsets of the Z-coordinates lie on different Z-planes of the at least two pre-defined Z-planes. Thus, the same Z-coordinate of an object scan may not appear on more than one discrete plane.

In one embodiment of the form of Rule ii) represented in FIG. 10, object scan 1000 is sparsely, or fractionally, sub-sampled within each discrete Z-plane such that each Z-plane 1008 contains a unique set of X-Y addressable picture element locations.

Expressed in general terms, one embodiment of a form of Rule ii) is wherein the X-coordinates and Y-coordinates form pairs of X-Y coordinates, and wherein each different pre-defined Z-plane of the at least two different pre-defined Z-planes comprises a different non-overlapping subset of the pairs of X-Y coordinates.

The particular case of no repeated X-Y coordinates in any of the discrete planes may be conditional; for an equal number of addressable picture elements in each discrete plane, the sum of fractional addressable picture elements may not exceed the total number of addressable picture elements of a single discrete plane. As an example of a variation of this embodiment; any one of the five Z-planes 1008 could have a 40% fraction of addressable picture elements, any two of the five discrete Z-planes could have 20% of the addressable picture elements and any two of the five discrete Z-planes could have 10% of the addressable picture elements and wherein the number of addressable picture elements is the same in each of the five Z-planes. The aggregate number of sub-sampled addressable picture elements sum to 100% of the possible addressable picture elements in a single plane. This embodiment is readily extensible to "W" Z-planes, where "W" is a positive whole number greater than 1.

In another embodiment in a form of Rule ii), the fractional addressable picture elements sub-sampled from any discrete Z-plane may vary from greater than 0% to up to 100% of the possible addressable picture elements. In this particular embodiment, X-Y coordinates could be repeated on one or more discrete Z-planes. Allowing the scan sparsity to vary on each discrete pre-defined Z-plane represents an adaptive strategy to improve the sparse, or fractional, sub-sampling distribution of an object scan. For example, the heterogeneity of an object may vary, or it is desired to limit the scanning probe interaction (e.g., object damage due to electron beam dose) by varying the sub-region sparsity of an object scan.

In one embodiment of the sparse sampling system 108 configured as an X-Y-Z pattern generator wherein the Z-coordinate is invoked by Rule ii) and implemented in an optical scanning probe instrument, the focal condition which defines the Z-plane may be actioned through a computer-controlled process using a DAC output of the scanning system described by this disclosure.

In one embodiment of the sparse sampling system 108 configured as an X-Y-Z pattern generator wherein the Z-coordinate is invoked by Rule ii) and implemented in an optical scanning probe instrument, the focal condition which defines the Z-plane may be actioned through a computer-controlled process using an Application Programmer Interface (API) module.

In one embodiment of the form of Rule ii) the pre-defined Z-planes are not equidistant in the Z-direction. This embodiment represents an adaptive strategy to improve the sparse, or fractional, sub-sampling distribution of an object scan.

In one embodiment, one or more Z-planes have a different number of addressable picture elements. For instance, one Z-plane could be represented by 1024 by 1024 addressable picture elements and another Z-plane of the same object scan could be represented 4096 by 4096 addressable picture elements. The ability to vary the number of addressable picture elements in each pre-defined discrete Z-plane through this embodiment represents an adaptive strategy to improve the sparse, or fractional, sub-sampling distribution of an object scan.

Figures 11A, 11B, 11C, 11D:
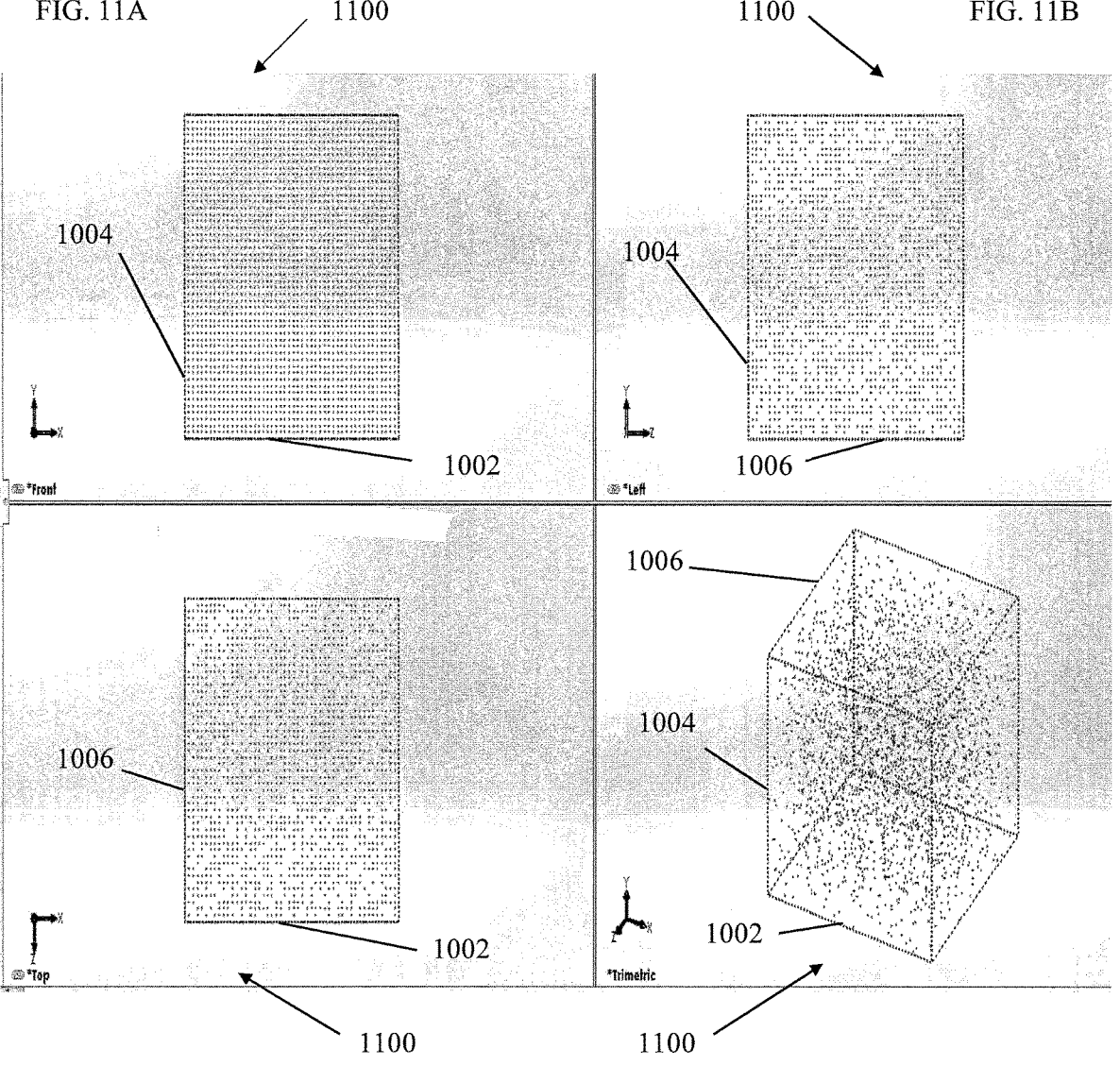
FIGS. 11A-11D are graphical representations of X-Y-Z sparse, or fractional, sub-sampling of an object in which Z-coordinates are defined through the action of predetermined rules in accordance with another embodiment.

The form of Rule iii) graphically represented in FIGS. 11A-11D randomly modulates in a positive or negative Z-direction the Z-coordinates of an object scan discrete Z-planes. FIG. 11A is a view of object scan 1100, along the Z direction 1006 (labeled in FIG. 11B). FIG. 11B is a view of object scan 1100, along the X-direction 1002 (labeled in FIG. 11A). FIG. 11C is a view of object scan 1100 along the Y-direction 1004 (labeled in FIG. 11A), and FIG. 11D is a trimetric X-Y-Z perspective view of object scan 1100. The X-Y coordinates of the sub-sampled object scan in FIGS. 11A-11D are identical to the X-Y coordinates of the sub-sampled object scan depicted in FIGS. 10A-10D. The Z-coordinate of the sub-sampling in FIGS. 11A-11D are randomly modulated in the positive or negative Z-direction about each of the finite Z-planes represented in FIGS. 10A-10D to improve object scan randomization.

In one embodiment of Rule iii), the magnitude of the Z-direction modulation is restricted to less than, or equal to, half the distance to the next discrete Z-plane in either Z-direction. Restricting the magnitude of the random modulation to less than, or equal to, half the distance to the next discrete Z-plane, and wherein each Z-plane has the same number of addressable picture elements, reduces likelihood of overlapping X-Y-Z coordinates. The number and relative separation of the pre-determined Z-planes may be based upon a-priori knowledge of the object structure, such as varying density, or congestion of features of interest along the Z-direction.

A practical application of Rule ii) and Rule iii) and related embodiments thereof, is related to the ease of implementation of sparse, or fractional, sub-sampling implemented using scanning probe devices. For example, in a particular case of a STEM, X-Y coordinates of a scan pattern of an object scan are commonly determined by deflection of the scanning probe (e.g., electron beam deflected by scanning coils). In a particular embodiment, position of the Z-coordinate of the X-Y-Z scan coordinates of a scan pattern of an object scan may be actioned through the sparse sampling system 108 by transmitting signals to set a focal point of a scanning probe, and thereby concentrate the scanning probe region, to correspond to a particular Z-plane on the object.

In one embodiment of the sparse sampling system 108 configured as an X-Y-Z pattern generator wherein the Z-co-ordinate is invoked by Rule ii) and Rule iii) and imple-mented in an optical scanning probe instrument, the discrete Z-planes may be actioned through an automated computer-controlled process.

In one embodiment of the sparse sampling system 108 configured as an X-Y-Z pattern generator wherein the Z-co-ordinate is invoked by Rule ii) and Rule iii) and imple-mented in an optical scanning probe instrument, the discrete Z-planes may be actioned through a manual focus operation.

In one embodiment of the sparse sampling system 108 configured as an X-Y-Z pattern generator, the Z-coordinate may be invoked through the action of a scanning stage.

In one embodiment of the sparse sampling system 108 configured as an X-Y-Z pattern generator, the Z-coordinate may be invoked through the action of a combination of a scanning stage and a lensing system.

In the particular case of a Laser Scanning Confocal Microscope (LSCM) and similar scanning stage instru-ments, the X-Y-Z coordinates of a scan pattern of an object scan may be actioned by signals transmitted by the sparse sampling system 108, to inputs of an X-Y-Z stage, for example, a piezoelectric stage with nanometer or sub-nano-meter step size resolution.

In one embodiment of the disclosure according to Rule ii) and Rule iii), the discrete planes may be evenly distributed along the Z-dimension of an object scan.

In one embodiment of the disclosure according to Rule ii) and Rule iii), the discrete Z-planes may be unevenly dis-tributed. Subjective location of the pre-defined discrete planes represents an adaptive strategy to improve the sparse, or fractional, sub-sampling distribution of an object scan.

In one embodiment of Rule ii) and Rule iii), the X-Y-Z coordinates may define an unrepeated set of X-Y locations distributed on each discrete Z-plane. For instance, an 80% sparse sampled 4096×4096 scan allows up to five discrete Z-planes, each including 819×819 X-Y pixels, wherein each discrete Z-plane is comprised of unique and unrepeated sequences of X-Y pixel positions within the 4096×4096×5 sparse data cube. Therefore, discrete Z-plane 2 contains no identical X-Y coordinate from Z-plane 1, discrete Z-plane 3 contains no duplicated X-Y coordinate from Z-plane 1 or 2. Discrete Z-plane 4 contains no duplicated X-Y coordinate from Z-planes 1, 2 or 3. And discrete Z-plane 5 contains no duplicated X-Y coordinate from Z-planes 1, 2, 3 or 4. This particular embodiment is graphically illustrated in FIGS. 10A-10D, using a 50×50×5 pixel array for illustrative pur-pose.

In one embodiment of Rule ii) and Rule iii), two or more sets of sparse sampled X-Y coordinates of an object scan may be sequenced or shuffled in a prescribed, or random, manner to generate a set of pre-defined Z-planes. For instance, an 80% sparse set of X-Y coordinates of an object scan can form a set of up to five Z-planes with unique and unrepeated X-Y coordinates and that set may, in turn, be repeated once to form ten Z-planes, or repeated twice to produce fifteen Z-planes, etc.

The form of Rule iv) randomly modulates the Z-coordi-nates of the scan pattern coordinates of an object scan over the Z-dimension of the object scan. In one embodiment in a form of Rule iv) the first and second primary carrier signals comprise X-Y components of a two-dimensional space-filling curve wherein the first and second secondary X-Y signals randomly modulate the primary carrier signal to define the X-Y coordinates of an object scan and wherein the Z-coordinates of the object scan are randomly modulated in the positive or negative Z-direction. Rule iv) may be con-sidered as a particular combination of Rule ii) and Rule iii) wherein the number of discrete planes is reduced to one. A practical application of Rule iv) is when the dimension of the object scan in the Z-direction is of a sufficiently small magnitude, and/or the scanning method in the Z-direction is sufficiently responsive, that modulations do not result in artifacts including, but not limited to, slew, hysteresis and positional error. For instance, in the case of Rule iii), and wherein the pre-determined number of Z-planes equal to five produces a faithful reconstructed representation of an object; an object scan of an otherwise similar object, but with one-fifth the Z-dimension, could be reconstructed from data acquired using sparse sampling system 108 by Rule iv).

In one embodiment of the sparse sampling system 108 configured as an X-Y-Z pattern generator, the Z-coordinate Rule i) through Rule iv) may be invoked through the action of a lensing system.

In one embodiment of the sparse sampling system 108 configured as an X-Y-Z pattern generator wherein Rule ii), Rule iii) and Rule iv) is implemented on an optical scanning probe instrument, the Z-coordinate may be invoked through the action of the lensing system to focus the probe on a designated Z-plane, or modulate the Z-coordinate through overfocus (below the plane) and/or underfocus (above the plane).

In one embodiment of the sparse sampling system 108 configured as an X-Y-Z pattern generator, the lens system may be a light optical system, such as a Laser Scanning Confocal Microscope (LSCM).

In one embodiment of the sparse sampling system 108 configured as an X-Y-Z pattern generator, the lens system may be an electrostatic, electromagnetic, or combination electrostatic-electromagnetic lensing system, including those lensing systems in a STEM.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive.

One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subse-quent arrangement designed to achieve the same or similar purpose may be substituted for the specific embodiments shown. This disclosure is intended to cover any and all subsequent adaptations or variations of various embodi-ments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or is described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system comprising:
a sparse sampling system having a processor and a non-transitory computer-readable medium, the sparse sampling system configured to generate:
a first programmable primary carrier signal and a first secondary programmable signal that modulates the first programmable primary carrier signal through a first randomized modulation that defines X-coordinates of a set of scan pattern coordinates of an object scan;
a second programmable primary carrier signal and a second secondary programmable signal that modulates the second programmable primary carrier signal through a second randomized modulation that defines Y-coordinates of the set of scan pattern coordinates of the object scan, wherein each of the first and second programmable primary carrier signals comprises X-Y components of a at least two-dimensional space-filling curve, and wherein a resultant randomized modulation produced by combined action of the first and second secondary programmable signals is independent of the at least two-dimensional space-filling curve;
a third programmable output signal that defines Z-coordinates of the set of scan pattern coordinates of the object scan based on a predetermined rule, and
wherein the sparse sampling system is further configured to transmit the generated first and second programmable primary carrier signals, the first and second secondary programmable signals, and the third programmable output signal to a scanning probe device.

2. The system of claim 1 and wherein the X-coordinates and the Y-coordinates of the set of scan pattern coordinates of the object scan sample less than 100% of a predetermined set of addressable picture elements of the object scan.

3. The system of claim 1 and wherein the X-coordinates, Y-coordinates and Z-coordinates of the set of scan pattern coordinates of the object scan sample less than 100% of a predetermined set of addressable picture elements of the object scan.

4. The system of claim 1 and wherein the third programmable primary carrier signal comprises Z-components of a three-dimensional space-filling curve.

5. The system of claim 1 and wherein:
the first programmable primary carrier signal is divided into different sub-divisions, and wherein each of the different sub-divisions is modulated by the first secondary programmable signal through the first randomized modulation to provide different subsets of X-coordinates that together define the X-coordinates of the set of scan pattern coordinates of the object scan; and
the second programmable primary carrier signal is divided into different sub-divisions, and wherein each of the different sub-divisions is modulated by the second secondary programmable signal through the second randomized modulation to provide different subsets of Y-coordinates that together define the Y-coordinates of the set of scan pattern coordinates of the object scan.

6. The system of claim 1 and wherein the predetermined rule comprises defining the Z-coordinates of the set of scan pattern coordinates of the object scan by a third programmable primary carrier signal and a third secondary programmable signal that modulates the third programmable primary carrier signal through a third randomized modulation, wherein the third programmable primary carrier signal and the third secondary programmable signal constitute the third programmable output signal.

7. The system of claim 6 and wherein:
the first programmable primary carrier signal is divided into different sub-divisions, and wherein each of the different sub-divisions is modulated by the first secondary programmable signal through the first randomized modulation to provide different subsets of X-coordinates that together define the X-coordinates of the set of scan pattern coordinates of the object scan;
the second programmable primary carrier signal is divided into different sub-divisions, and wherein each of the different sub-divisions is modulated by the second secondary programmable signal through the second randomized modulation to provide different subsets of Y-coordinates that together define the Y-coordinates of the set of scan pattern coordinates of the object scan; and
the third programmable primary carrier signal is divided into different sub-divisions, and wherein each of the different sub-divisions is modulated by the third secondary programmable signal through the third randomized modulation to provide different subsets of Z-coordinates that together define the Z-coordinates of the set of scan pattern coordinates of the object scan.

8. The system of claim 6 and wherein the third programmable primary carrier signal comprises Z-components of a three-dimensional space-filling curve.

9. The system of claim 8 and wherein the three-dimensional space-filling curve comprises a three-dimensional Hilbert space-filling curve.

10. The system of claim 1 and wherein the predetermined rule comprises the Z-coordinates of the set of scan pattern coordinates of the object scan defined as discretized on at least two pre-defined Z-planes, such that different non-overlapping subsets of the Z-coordinates lie on different Z-planes of the at least two pre-defined Z-planes.

11. The system of claim 10 and wherein the X-coordinates and Y-coordinates form pairs of X-Y coordinates, and wherein each different pre-defined Z-plane of the at least two different pre-defined Z-planes comprises a different non-overlapping subset of the pairs of X-Y coordinates.

12. The system of claim 1 and wherein the predetermined rule comprises defining Z-coordinates as being modulated randomly in positive or negative directions relative to at least two pre-defined Z planes, such that a first non-overlapping subset of the Z-coordinates is modulated randomly in the positive or negative directions relative to a first pre-defined Z-plane of the at least two pre-defined Z-planes, and a second non-overlapping subset of the Z-coordinates is modulated randomly in the positive or negative directions relative to a second pre-defined Z-plane of the at least two pre-defined Z-planes, and wherein a modulation magnitude is equal to or less than half a distance between the first pre-defined Z-pane and the second pre-defined Z-plane.

13. The system of claim 1 and wherein the predetermined rule comprises defining the Z-coordinates of the set of scan pattern coordinates of the object scan by a third programmable primary carrier signal and a third secondary programmable signal that modulates the third programmable primary carrier signal through a third randomized modulation in a positive or a negative Z-direction.

14. The system of claim 1 and wherein the sparse sampling system comprises a controller and a signal converter coupled to the controller, and wherein the signal converter comprises at least one digital-to-analog converter (DAC), and wherein the controller is configured to provide the first and second programmable primary carrier signals and the first and second secondary programmable signals to the signal converter.

15. The system of claim 1 and wherein the sparse sampling system comprises a controller configured to provide the first and second programmable primary carrier signals and the first and second secondary programmable signals to digital signal inputs on the scanning probe device.

16. The system of claim 1 and wherein the Z-coordinates of the set of scan pattern coordinates of the object scan are defined by a third programmable primary carrier signal and a third secondary programmable signal that modulates the third programmable primary carrier signal through a third randomized modulation, and wherein the sparse sampling system comprises a controller and a signal converter coupled to the controller, and wherein the signal converter comprises at least one digital-to-analog converter (DAC), and wherein the controller is configured to provide the third programmable primary carrier signal and the third secondary programmable signal to the signal converter.

17. The system of claim 1 and wherein the sparse sampling system comprises a controller configured to provide signals that define Z-coordinates of the scan pattern coordinates of the object scan to digital signal inputs on the scanning probe device.

18. A method comprising:
  generating, by a sparse sampling system having a processor and a non-transitory computer-readable medium, a first programmable primary carrier signal and a first secondary programmable signal that modulates the first programmable primary carrier signal through a first randomized modulation that defines X-coordinates of a set of scan pattern coordinates of an object scan;
  generating, by the sparse sampling system, a second programmable primary carrier signal and a second secondary programmable signal that modulates the second programmable primary carrier signal through a second randomized modulation that defines Y-coordinates of the set of scan pattern coordinates of the object scan, wherein each of the first and second programmable primary carrier signals comprises X-Y components of a at least two-dimensional space-filling curve, and wherein a resultant randomized modulation produced by combined action of the first and second secondary programmable signals is independent of the at least two-dimensional space-filling curve;
  generating, by the sparse sampling system, a third programmable output signal that defines Z-coordinates of the set of scan pattern coordinates of the object scan based on a predetermined rule, and
  transmitting, by the sparse sampling system, the generated first and second programmable primary carrier signals, the first and second secondary programmable signals, and the third programmable output signal to a scanning probe device.

19. An apparatus comprising:
  a sparse sampling pattern generator configured to generate:
    a first programmable primary carrier signal and a first secondary programmable signal that modulates the first primary carrier signal through a first randomized modulation that defines X-coordinates of a set of scan pattern coordinates of an object scan; and
    a second programmable primary carrier signal and a second secondary programmable signal that modulates the second primary carrier signal through a second randomized modulation that defines Y-coordinates of the set of scan pattern coordinates of the object scan; and
    a third programmable output signal that defines Z-coordinates of the set of scan pattern coordinates of the object scan based on a predetermined rule;
  a controller coupled to the sparse sampling pattern generator and configured to provide the first and second programmable primary carrier signal, the first and second secondary programmable signal, and the third programmable output signal to scan inputs of a scanning probe device configured to scan an object;
  at least one object signal response converter configured to receive analog scan response signals from at least one object response detector that detects a response of the object to scan probe signals directed at the object by the scanning probe device, the at least one object response converter coupled to the controller and configured to convert the analog scan response signals to digital scan response signals; and
  a sampling reconstruction system communicatively coupled to the controller, the sampling reconstruction system configured to receive the digital scan response signals from the controller, and responsively reconstruct an amalgamate image of the object scanned by the scanning probe device from the sampled object response signals.

20. The apparatus of claim 19, and wherein the sampling reconstruction system is configured to reconstruct the amalgamate image using adaptive real-time inpainting.

* * * * *